United States Patent
Yun et al.

(10) Patent No.: US 12,016,247 B2
(45) Date of Patent: Jun. 18, 2024

(54) PACKAGE COMPRISING AN INTEGRATED PASSIVE DEVICE CONFIGURED AS A CAP FOR A FILTER

(71) Applicant: QUALCOMM Incorporated, San Diego, CA (US)

(72) Inventors: Changhan Hobie Yun, San Diego, CA (US); Nosun Park, Incheon (KR); Daniel Daeik Kim, San Diego, CA (US); Paragkumar Ajaybhai Thadesar, San Diego, CA (US); Sameer Sunil Vadhavkar, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 792 days.

(21) Appl. No.: 17/005,168

(22) Filed: Aug. 27, 2020

(65) Prior Publication Data
US 2022/0069193 A1    Mar. 3, 2022

(51) Int. Cl.
*H10N 30/00*    (2023.01)
*H03H 9/02*    (2006.01)

(52) U.S. Cl.
CPC .... *H10N 30/1051* (2023.02); *H03H 9/02015* (2013.01); *H03H 9/02535* (2013.01)

(58) Field of Classification Search
CPC ........... H10N 30/1051; H03H 9/02015; H03H 9/02535; H03H 3/02; H03H 3/08; H03H 9/1014; H03H 9/1071; H03H 9/0547

USPC .......................... 333/133, 187, 188, 193–196
See application file for complete search history.

(56) References Cited

U.S. PATENT DOCUMENTS

| | | | |
|---|---|---|---|
| 2007/0170565 A1 | 7/2007 | Hong et al. | |
| 2008/0217708 A1 | 9/2008 | Reisner et al. | |
| 2014/0354114 A1 | 12/2014 | Moriya et al. | |
| 2015/0341016 A1* | 11/2015 | Iwaki | H03H 9/02228 333/133 |
| 2018/0269849 A1 | 9/2018 | Matsumoto et al. | |
| 2020/0020473 A1 | 1/2020 | Yun et al. | |
| 2020/0235716 A1* | 7/2020 | Eid | H01L 23/66 |

FOREIGN PATENT DOCUMENTS

WO    2019132924 A1    7/2019

OTHER PUBLICATIONS

International Search Report and Written Opinion—PCT/US2021/045001—ISA/EPO—Nov. 24, 2021.

* cited by examiner

*Primary Examiner* — Rakesh B Patel
*Assistant Examiner* — Jorge L Salazar, Jr.
(74) *Attorney, Agent, or Firm* — Loza & Loza, LLP

(57) ABSTRACT

A package that includes an integrated device, an integrated passive device and a void. The integrated device is configured as a filter. The integrated device includes a substrate comprising a piezoelectric material, and at least one metal layer coupled to a first surface of the first substrate. The integrated passive device is coupled to the integrated device. The integrated passive device is configured as a cap for the integrated device. The void is located between the integrated device and the integrated passive device.

22 Claims, 26 Drawing Sheets

SIDE PROFILE VIEW

*SIDE PROFILE VIEW*

*SIDE PROFILE VIEW*

SIDE PROFILE VIEW

SIDE PROFILE VIEW

SIDE PROFILE VIEW

*SIDE PROFILE VIEW*

PLAN VIEW

PLAN VIEW

ACOUSTIC FILTER + INTEGRATED PASSIVE DEVICE CONFIGURED AS CAP / ROOF

PLAN VIEW

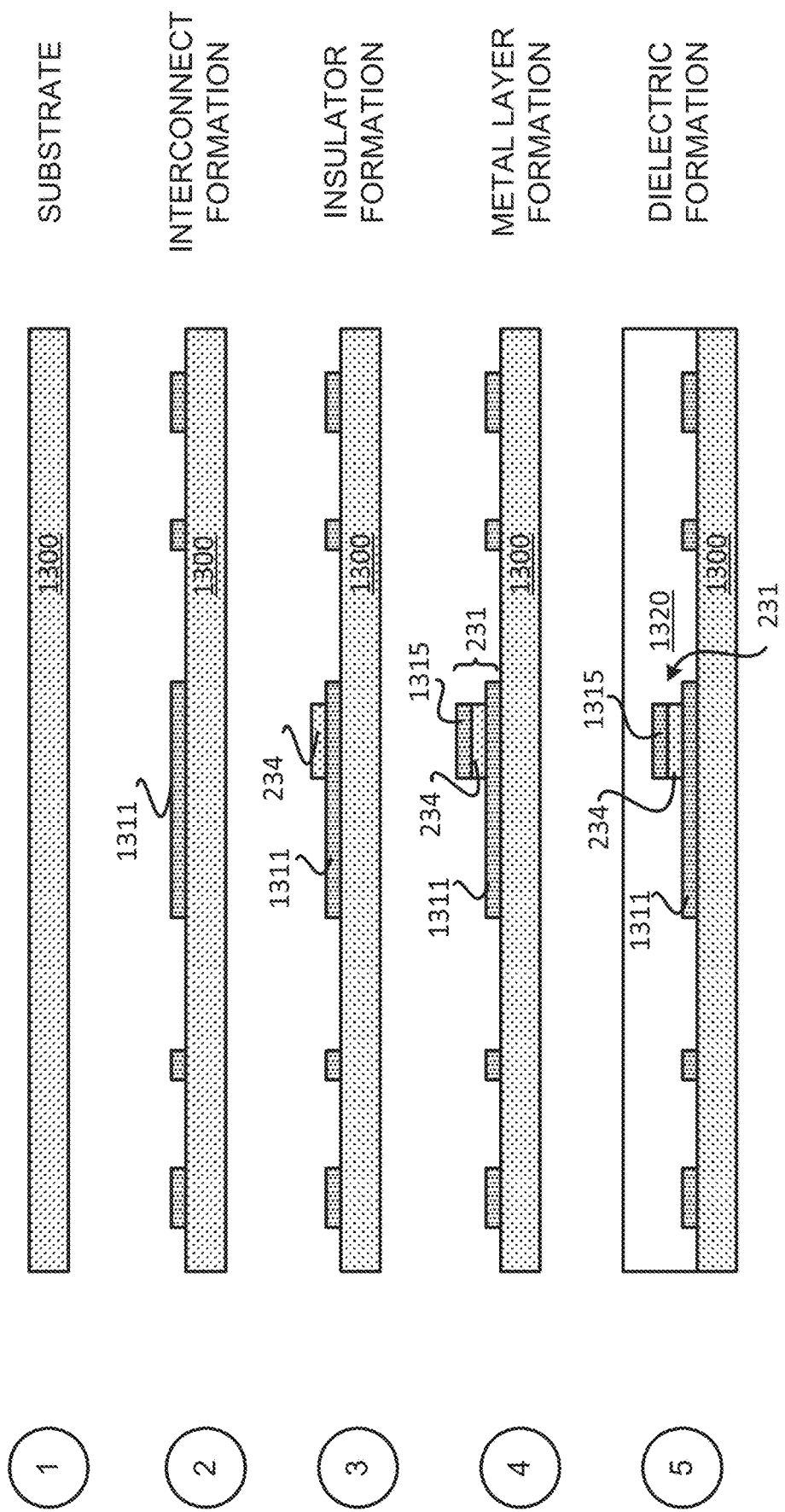

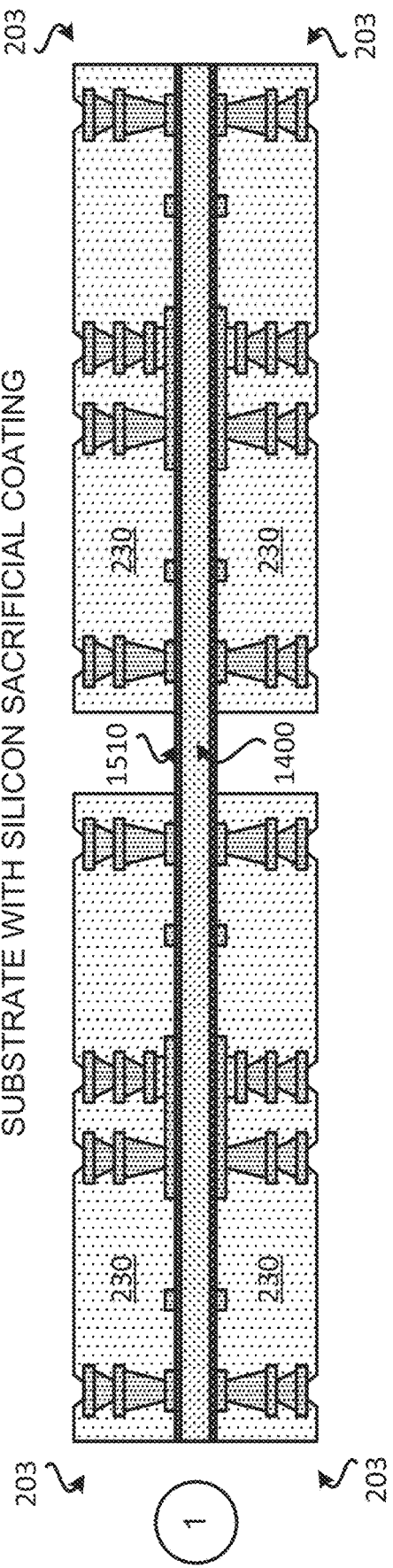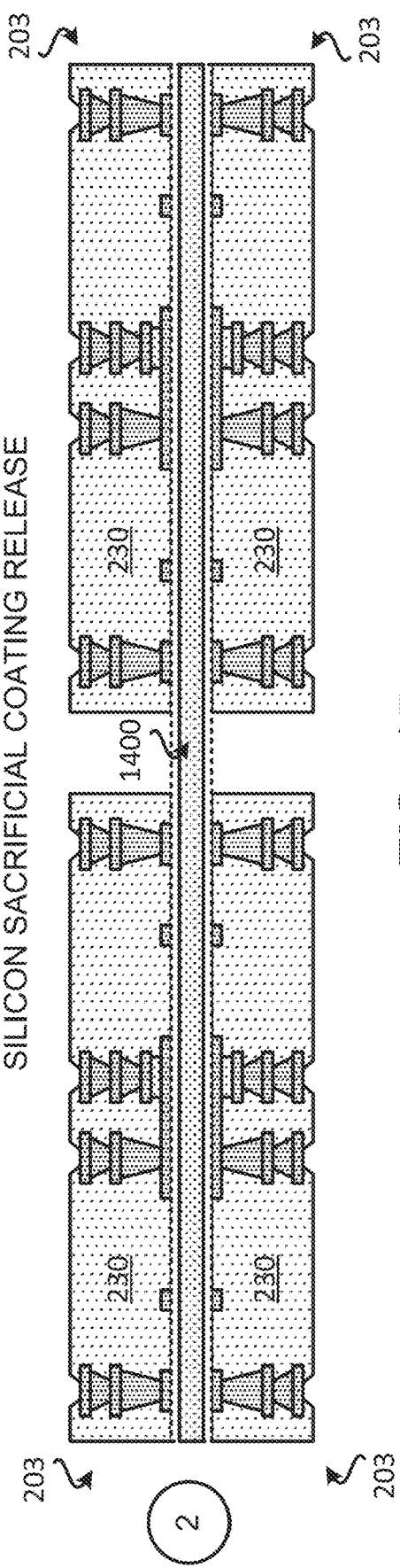
FIG. 15

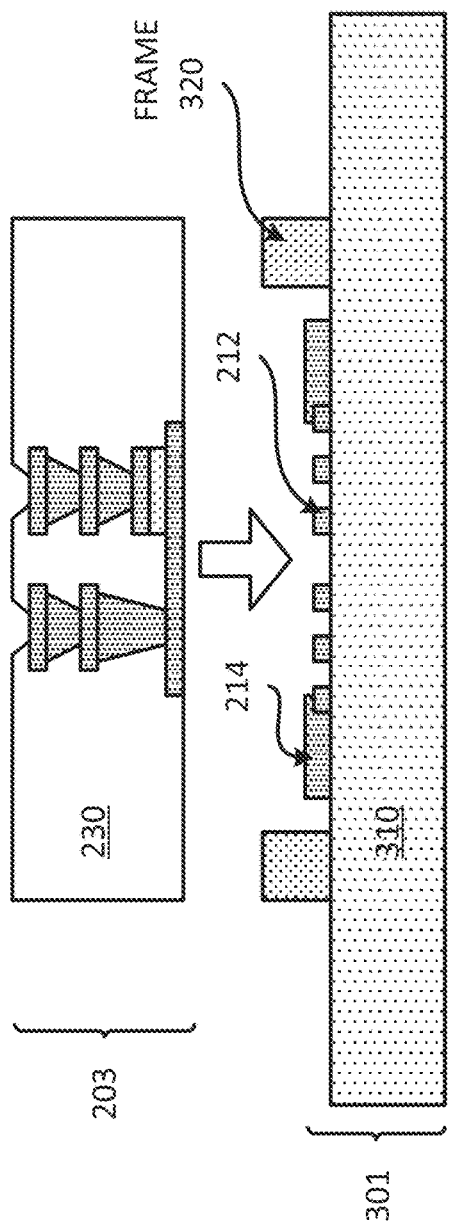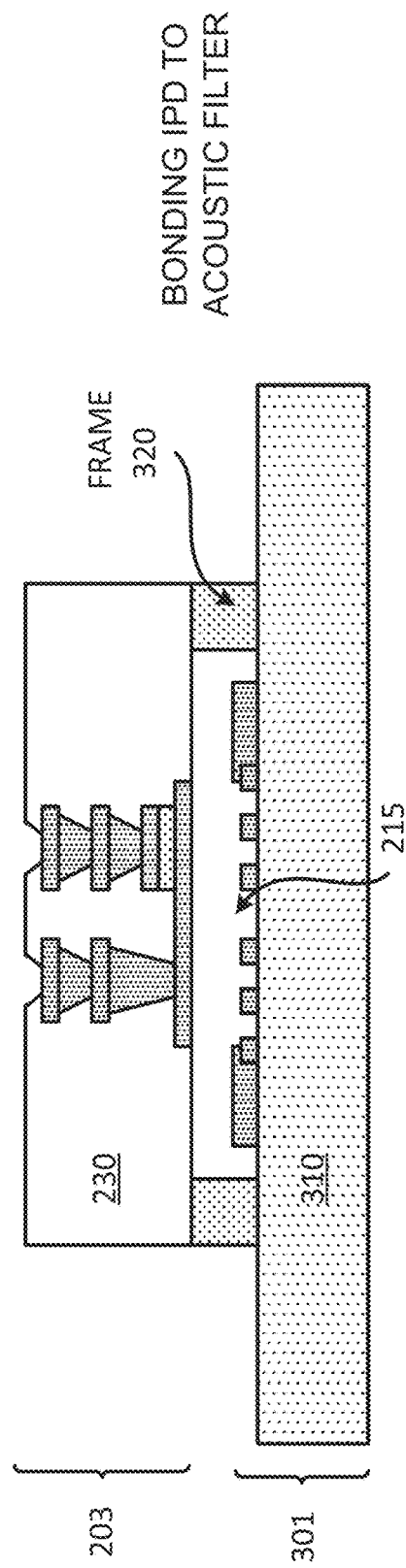
FIG. 17A

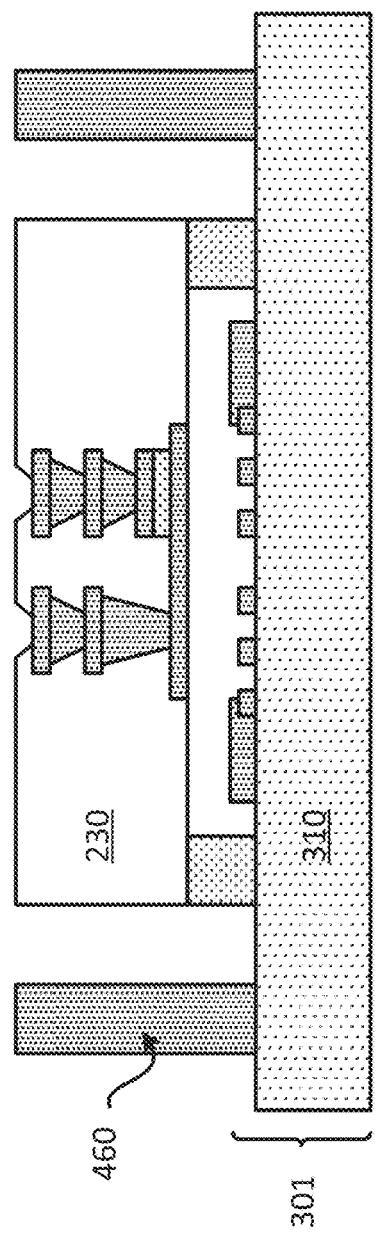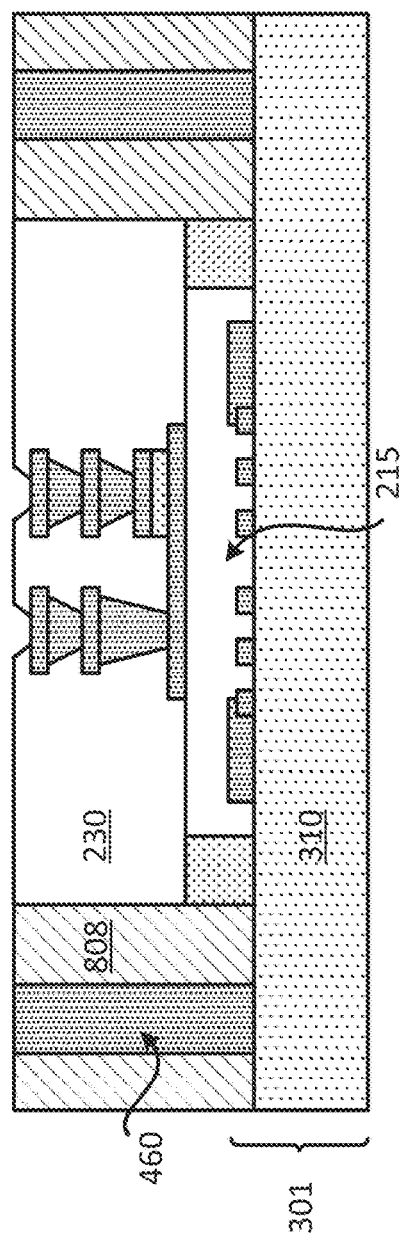
FIG. 17B

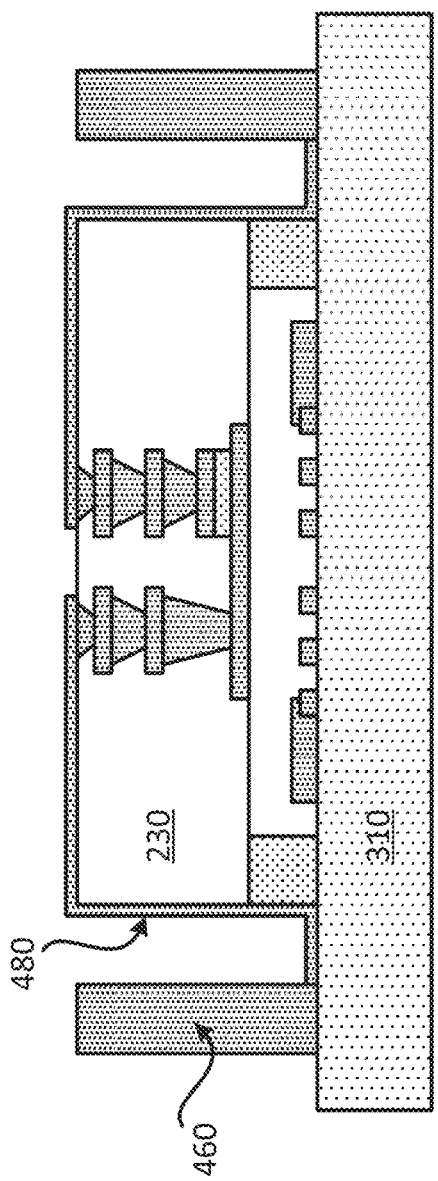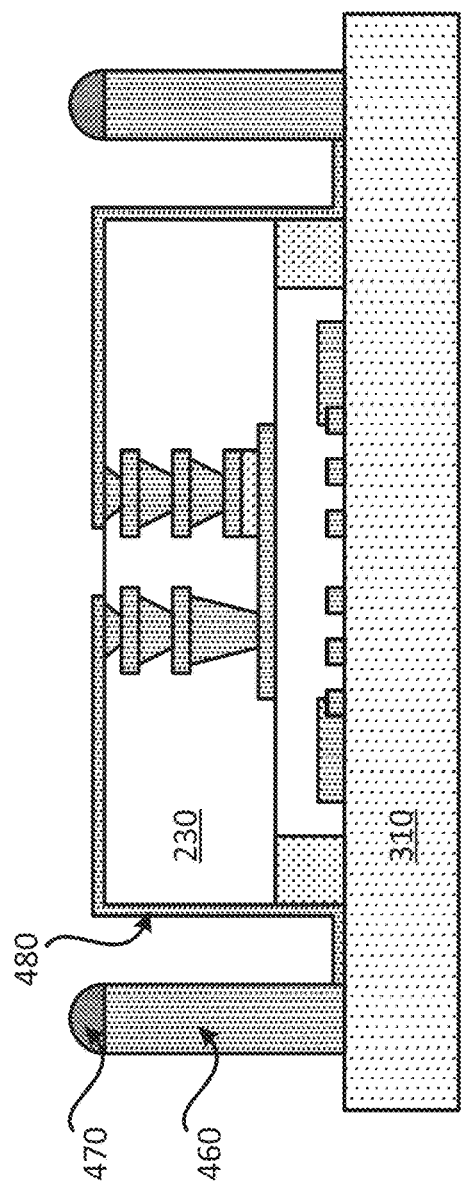
FIG. 18B

PACKAGE COMPRISING AN INTEGRATED PASSIVE DEVICE CONFIGURED AS A CAP FOR A FILTER

FIELD

Various features relate to a filter implemented in an integrated device, but more specifically to a package that includes an integrated passive device.

BACKGROUND

Radio frequency (RF) filters are components of a wireless device for filtering out unwanted signals. For example, a RF filter may be used to filter out signals at various frequencies, while letting through signals at a certain frequency. A wireless device may be configured to operate at different frequencies by including many RF filters, where each RF filter is configured to allow a certain signal with a certain frequency to pass through, thereby allowing the wireless device to operate and/or communicate at that frequency. However, RF filters take up a lot of space. Moreover, RF filters are often coupled to passive devices, such as inductors and capacitors. These passive devices also take up a lot of space. A small wireless device has space constraints and may not be able to accommodate many RF filters and/or many passive devices, which limits the number of frequencies the small wireless device may operate and/or communicate at. There is an ongoing need to provide RF filters and passive devices with better form factors and smaller sizes so that the RF filters and passive devices may be implemented in smaller devices.

SUMMARY

Various features relate to a filter implemented in an integrated device, but more specifically to a package that includes an integrated passive device.

One example provides a package that includes an integrated device, an integrated passive device and a void. The integrated device is configured as a filter. The integrated device includes a substrate comprising a piezoelectric material, and at least one metal layer coupled to a first surface of the first substrate. The integrated passive device is coupled to the integrated device. The integrated passive device is configured as a cap for the integrated device. The void is located between the integrated device and the integrated passive device.

Another example provides an apparatus that includes means for acoustic filter, means for passive functionality coupled to the means for acoustic filtering, where the means for passive functionality is configured as a cap for the means for acoustic filtering. The apparatus also includes a void located between the means for acoustic filtering and the means for capacitance. The means for passive functionality may include means for capacitance and/or means for inductance.

Another example provides a method for fabricating a package. The method provides an integrated device configured as a filter. The integrated device includes a substrate comprising a piezoelectric material and at least one metal layer coupled to a first surface of the substrate. The method couples an integrated passive device to the integrated device, where the integrated passive device is configured as a cap for the integrated device, where coupling the integrated passive device to the integrated device forms a void located between the integrated device and the integrated passive device.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 13A-13D illustrate an exemplary sequence for fabricating an integrated passive device configured as a cap for a filter.

FIG. 15 illustrates an exemplary sequence for fabricating an integrated passive device configured as a cap for a filter.

FIG. 17A-17C illustrate an exemplary sequence for fabricating a package that includes an integrated device configured as a signal filter, and an integrated passive device configured as a cap for the filter.

FIG. 18A-18B illustrate an exemplary sequence for fabricating a package that includes an integrated device configured as a signal filter, and an integrated passive device configured as a cap for the filter.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes an integrated device, an integrated passive device and a void. The integrated device is configured as a filter. The integrated device includes a substrate comprising a piezoelectric material, and at least one metal layer coupled to a first surface of the first substrate. The integrated passive device is coupled to the integrated device. The integrated passive device is configured as a cap for the integrated device. The void is located between the integrated device and the integrated passive device. The integrated passive device may be a substrate-less integrated passive device. The filter may be signal filters (e.g., radio frequency (RF) filters). The configuration of the package provides a package with a more compact form factor and a smaller footprint, while providing a filter coupled to an integrated passive device. For example, stacking the integrated passive device over the integrated device configured as a filter, or vice versa, reduces the laterally size of the package, while still providing a relatively thin package.

Figure 1:
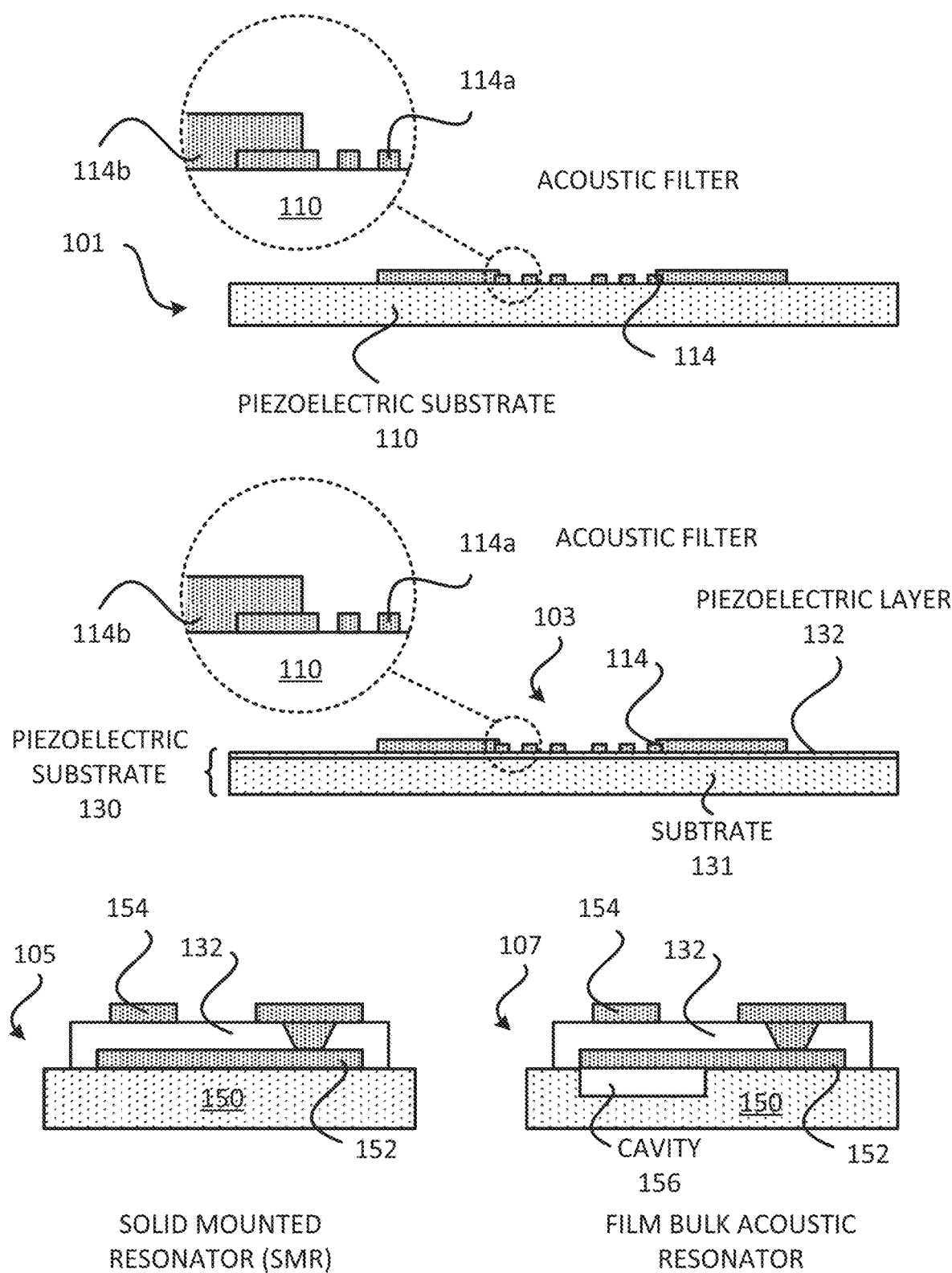
FIG. 1 illustrates several integrated devices, each configured to operate as a signal filter.

Exemplary Devices Comprising a Filter and a Passive Device Configured as a Cap for the Filter FIG. 1 illustrates a profile view of several exemplary devices configured as filters. FIG. 1 illustrates a device 101 (e.g., integrated device, bare die) that is configured to operate as a filter, a device 103 (e.g., integrated device, bare die) that is configured to operate as another filter, a device 105 (e.g., integrated device, bare die) that is configured to operate as another filter, and a device 107 (e.g., integrated device, bare die) that is configured to operate as another filter. A filter device may be a signal filter device. A filter device may be an acoustic filter device. A filter device may include a radio frequency (RF) filter. The device(s) (e.g., 101, 103, 105, 107) may be implemented in a radio frequency front end (RFFE) package. The device(s) (e.g., 101, 103, 105, 107) may be implemented as a device. The device(s) (e.g., 101, 103, 105, 107) may be implemented as a micro-electromechanical system (MEMS) device. The devices 101 and 103 may be configured as acoustic wave (SAW) filters. The devices 105 and 107 may be configured as bulk acoustic wave (BAW) filters.

As shown in FIG. 1, the device 101 includes a substrate 110 and a metal layer 114. The substrate 110 may be a piezoelectric substrate. The substrate 110 may include a piezoelectric material (e.g., Aluminum Nitride (AlN), Lithium Niobate, Lithium Tantalate).

The metal layer 114 is formed over and coupled to the substrate 110. The metal layer 114 may include an electrically conductive material, such as Aluminum (Al), Molybdenum (Mo), and/or copper (Cu). The metal layer 114 may be patterned and/or configured as interconnects, electrodes and/or transducers for the device 101. In some implementations, the metal layer 114 may include one or more metal layers. For example, the metal layer 114 may include a first metal layer 114a and a second metal layer 114b. The first metal layer 114a may be thinner than the second metal layer 114b. The first metal layer 114a may be configured to operate as at least one transducer, and the second metal layer 114b may be configured as at least one interconnect coupled to the transducer. In another example, the piezoelectric substrate may include a substrate and a piezoelectric layer that is formed and located over a surface of the substrate.

FIG. 1 illustrates the device 103 that includes a piezoelectric substrate 130 and the metal layer 114. The piezoelectric substrate 130 may include a substrate 131 and a piezoelectric layer 132 located over a surface of the substrate 131. The substrate 131 may include glass with the piezoelectric layer 132 formed and located over a surface of the glass. Other materials may be used instead of glass. The piezoelectric layer 132 may include a piezoelectric material (e.g., Aluminum Nitride (AlN), Lithium Niobate, Lithium Tantalate). The metal layer 114 is formed over and coupled to the substrate 130. For example, at least some of the metal layer 114 may be formed over and coupled to a surface of the piezoelectric layer 132. Some of the metal layer 114 may be formed over and coupled to a surface of the substrate 131. The metal layer 114 may include an electrically conductive material, such as Aluminum (Al), Molybdenum (Mo), and/or copper (Cu). The metal layer 114 may be patterned and/or configured as interconnects, electrodes and/or transducers for the device 101. In some implementations, the metal layer 114 may include one or more metal layers. For example, the metal layer 114 may include a first metal layer 114a and a second metal layer 114b. The first metal layer 114a may be thinner than the second metal layer 114b. The first metal layer 114a may be configured to operate as at least one transducer, and the second metal layer 114b may be configured as at least one interconnect coupled to the transducer.

A piezoelectric substrate as used in the disclosure may mean a substrate that includes a piezoelectric material (e.g., as shown in the device 101) and/or a substrate that includes a piezoelectric layer coupled to and located over a surface of the substrate (e.g., as shown in the device 103). Different implementations may use different materials for the piezoelectric material and/or the piezoelectric layer.

The device 105 includes a substrate 150, a first metal layer 152, a piezoelectric layer 132, and a second metal layer 154. The piezoelectric layer 132 and the first metal layer 152 are located over the surface of the substrate 150. A via may couple a portion of the first metal layer 152 and a portion of the second metal layer 154. The piezoelectric layer 132 is located over the first metal layer 152. A second metal layer 154 is located over the piezoelectric layer 132. The device 105 may be configured as a solid mounted resonator (SMR). The substrate 150 may include silicon (Si). The piezoelectric layer 132 may include a piezoelectric material (e.g., Aluminum Nitride (AlN), Lithium Niobate, Lithium Tantalate). A portion of the first metal layer 152 may form a first electrode for the device 105, and a portion of the second metal layer 154 may form a second electrode for the device 105. The metal layers 152 and 154 may include an electrically conductive material, such as Aluminum (Al), Molybdenum (Mo), and/or copper (Cu).

The device 107 includes the substrate 150, the first metal layer 152, the piezoelectric layer 132, the second metal layer 154 and a cavity 156. The piezoelectric layer 132 and the first metal layer 152 are located over the surface of the substrate 150. A via may couple a portion of the first metal layer 152 and a portion of the second metal layer 154. The piezoelectric layer 132 is located over the first metal layer 152. A second metal layer 154 is located over the piezoelectric layer 132. The device 107 may be configured as a film bulk acoustic resonator. The substrate 150 may include silicon (Si). The piezoelectric layer 132 may include a piezoelectric material (e.g., Aluminum Nitride (AlN), Lithium Niobate, Lithium Tantalate). A portion of the first metal layer 152 may form a first electrode for the device 105, and a portion of the second metal layer 154 may form a second electrode for the device 105. The metal layers 152 and 154 may include an electrically conductive material, such as Aluminum (Al), Molybdenum (Mo), and/or copper (Cu). The cavity 156 may be located in the substrate 150. The cavity 156 may be located underneath a portion of the first metal layer 152.

Each of the device (e.g., 101. 103, 105, 107) (e.g., integrated circuit die) may be configured to operate as a surface acoustic wave (SAW) filter or a bulk acoustic wave (BAW) filter. Each device (e.g., 101. 103) may be configured to filter out signals at one or more frequencies and/or extract signals at one or more frequencies. The device (e.g., 101. 103, 105, 107) may be means for signal filtering and/or means for signal extraction. Signal filtering may include signal extraction.

Figure 2:
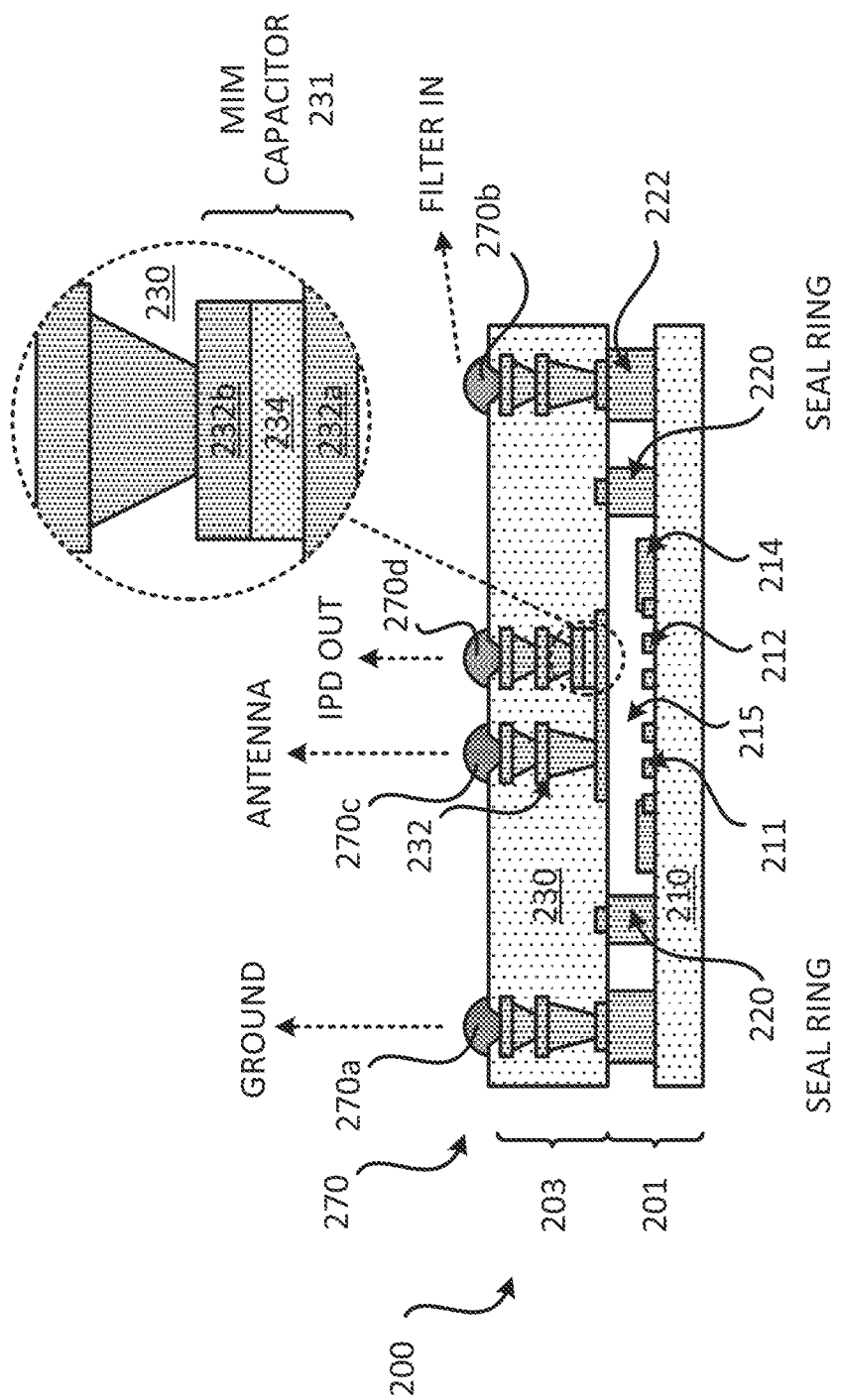
FIG. 2 illustrates a profile view of a package that includes an integrated device configured as a signal filter, and an integrated passive device configured as a cap for the filter.

FIG. 2 illustrates a package 200 that includes an integrated device 201, an integrated passive device 203, a void 215 and a seal ring 220. The integrated device 201 may be configured as a filter (e.g., acoustic filter, signal filter). The integrated device 201 includes a piezoelectric substrate 210 that includes a piezoelectric material, and at least one metal layer 211 coupled to a first surface of the substrate 210. The at least one metal layer 211 may be configured to operate as at least one transducer 212 and a plurality of interconnects 214. The integrated device 201 may include at least one interconnect 222. The integrated device 201 may be configured in a similar manner as the device 101 and/or the device 103. The seal ring 220 is coupled to a first surface of the substrate 210. The seal ring 220 may include a metal (e.g., copper). The seal ring 220 may be coupled to the substrate 210 through metal to metal bonding. For example, the seal ring 220 may be coupled (e.g., bonded) to interconnect(s) of the substrate 210. The seal ring 220 may laterally surround the at least one transducer 212. The integrated passive device 203 is coupled to the integrated device 201. The integrated passive device 203 may be coupled to the seal ring 220 and/or the interconnect 222. The integrated passive device 203 may be coupled to the seal ring 220 and/or the interconnect 222 through metal to metal bonding. The seal ring 220 and/or the interconnect 222 may be coupled to interconnects of the integrated passive device 203. The integrated device (e.g., 201, 301) may be means for acoustic filtering. The integrated passive device (e.g., 203) may be means for passive functionality.

The integrated passive device 203 is configured as a cap for the integrated device 201. The backside of the integrated passive device 203 may be configured as a cap and/or a roof for the integrated device 201. The void 215 is located between the integrated device 201 and the integrated passive device 203. A void may be a at least one region that is free of a solid material. A void may include a cavity. A void may be occupied by a gas (e.g., air). The void 215 may located over the at least one transducer 212. The seal ring 220 may laterally surround the void 215.

The integrated passive device 203 may be a substrate-less integrated passive device. The integrated passive device 203 includes at least one dielectric layer 230, a plurality of interconnects 232, an insulator layer 234 and a plurality of solder interconnects 270. The integrated passive device 203 includes a capacitor 231. The capacitor 231 may be a metal-insulator-metal (MIM) capacitor. The capacitor 231 may be a means for capacitance. The capacitor 231 may be defined by an interconnect 232a, the insulator layer 234 and an interconnect 232b. The insulator layer 234 is located between the interconnect 232a and the interconnect 232b. The insulator layer 234 may be a high k dielectric layer. It is noted that some of the interconnects from the plurality of interconnects 232 may be configured to operate as an inductor (e.g., spiral inductor). The inductor may be a means for inductance. The inductor may be configured to be electrically coupled to the capacitor 231. The capacitor 231 may be a means for capacitance.

As shown in FIG. 2, the integrated device 201 may be configured to be coupled to a ground solder interconnect 270a through interconnects from the plurality of interconnects 232 of the integrated passive device 203. For example, the at least one transducer 212 may be configured to be coupled to the ground solder interconnect 270a through the plurality of interconnects 214, the interconnect 222, interconnects from the plurality of interconnects 232. The integrated device 201 may be configured to be electrically coupled to other components of an electronic device through interconnects from the plurality of interconnects 232 and a filter in solder interconnect 270b. For example, the at least one transducer 212 may be configured to be electrically coupled to filter in solder interconnect 270b through the plurality of interconnects 214, the interconnect 222, interconnects from the plurality of interconnects 232. The integrated passive device 203 may be configured to be coupled to an antenna through an antenna solder interconnect 270c. The capacitor 231 of the integrated passive device 203 may be configured to be coupled to other components of an electronic device through an IPD out solder interconnect 270d.

The integrated device 201 may be configured to be electrically coupled to the integrated passive device 203 through at least one interconnect 222 coupled to the integrated device 201 and the integrated passive device 203. The at least one interconnect 222 is located between the integrated device 201 and the integrated passive device 203. An electrical signal from the integrated device 201 may be configured to travel through the integrated passive device 203. For example, the integrated device 201 and the integrated passive device 203 are configured to allow an electrical signal from the integrated device 201 to travel through the integrated passive device 203.

The integrated passive device 203 may be configured to provide (i) the capacitor 231, (ii) at least one electrical path for the integrated device 201, and (iii) a cap (e.g., roof) for the integrated device 201. Thus, the integrated passive device 203 (e.g., IPD) is configured to provide several functionalities for the package 200. This configuration provides a very compact form factor with a reduced footprint. The package 200 may be coupled to a substrate, an interposer or a printed circuit board (PCB) through the plurality of solder interconnects 270. Different implementations may have packages with different configurations of an integrated device and an integrated passive device.

Figure 3:
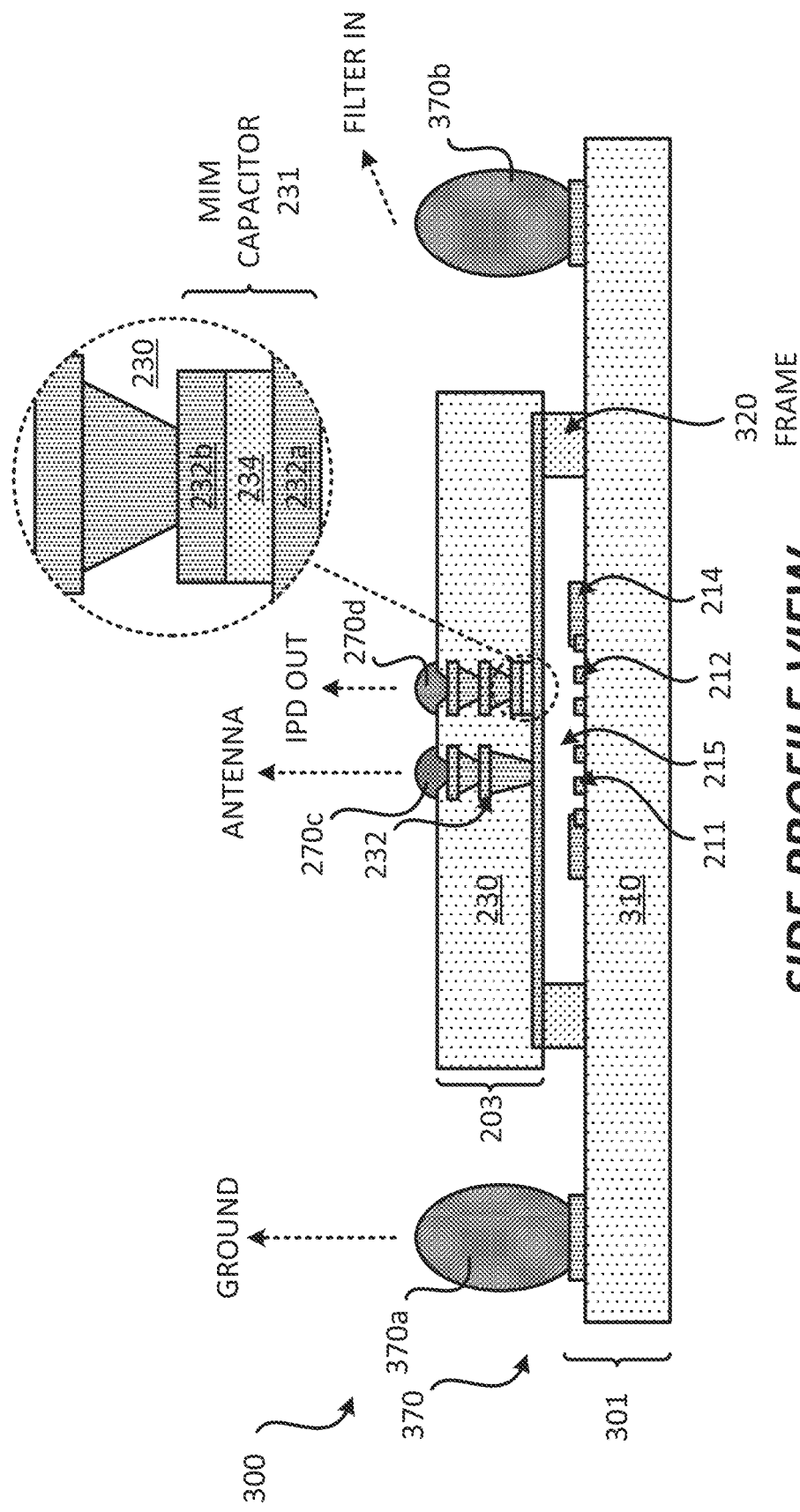
FIG. 3 illustrates a profile view of a package that includes an integrated device configured as a signal filter, and an integrated passive device configured as a cap for the filter.

FIG. 3 illustrates a package 300 that includes a filter and an integrated passive device that is configured to be a cap for the filter. The package 300 includes the integrated device 301, the integrated passive device 203 and a frame 320. The integrated device 301 may be configured as a filter (e.g., acoustic filter, signal filter). The integrated device 301 includes a piezoelectric substrate 310 that includes a piezoelectric material, and at least one metal layer 211 coupled to a first surface of the substrate 310. The at least one metal layer 211 may be configured to operate as at least one transducer 212 and a plurality of interconnects 214. The integrated device 301 may include at least one interconnect 222. The integrated device 301 may be configured in a similar manner as the device 101 and/or the device 103. The frame 320 is coupled to a first surface of the substrate 310. The frame 320 may be a polymer frame. The frame 320 may laterally surround the at least one transducer 212. The integrated passive device 203 is coupled to the integrated device 301 through the frame 320. A plurality of solder interconnects 370 is coupled to the interconnects of the substrate 310.

The integrated passive device 203 is configured as a cap for the integrated device 301. The backside of the integrated passive device 203 may configured as a cap and/or a roof for the integrated device 301. The void 215 is located between the integrated device 301 and the integrated passive device 203. A void may be a at least one region that is free of a solid material. A void may include a cavity. A void may be occupied by a gas (e.g., air). The void 215 may located over the at least one transducer 212. The frame 320 may laterally surround the void 215.

The integrated passive device 203 may be a substrate-less integrated passive device. The integrated passive device 203 includes at least one dielectric layer 230, the plurality of interconnects 232, the insulator layer 234 and the plurality of solder interconnects 270. The integrated passive device 203 includes a capacitor 231. The capacitor 231 may be a metal-insulator-metal (MIM) capacitor, as described in FIG. 2.

As shown in FIG. 3, the integrated device 301 may be configured to be coupled to a ground solder interconnect 370a. For example, the at least one transducer 212 may be coupled to the ground solder interconnect 370a through the plurality of interconnects 214. The integrated device 301 may be configured to be electrically coupled to other components of an electronic device through a filter in solder interconnect 370b. For example, the at least one transducer 212 may be configured to be electrically coupled to the filter in solder interconnect 370b through the plurality of interconnects 214. The integrated passive device 203 may be configured to be coupled to an antenna through an antenna solder interconnect 270c. The capacitor 231 of the integrated passive device 203 may be configured to be coupled to other components of an electronic device through an IPD out solder interconnect 270d.

The integrated device 301 may be configured to be electrically coupled to the integrated passive device 203 through the solder interconnects 270 (e.g., 270d) and the solder interconnects 370 (e., 370b). For example, the integrated device 301 and the integrated passive device 203 may be coupled to a substrate or a printed circuit board (PCB), through the solder interconnects 270 (e.g., 270d) and the solder interconnects 370 (e., 370b). In such instances, the integrated device 301 may be configured to be electrically coupled to the integrated passive device 203 through the solder interconnects 270 (e.g., 270d), interconnects in the substrate or PCB and the solder interconnects 370 (e., 370b).

The integrated passive device 203 may be configured to provide (i) the capacitor 231, and (iii) a cap (e.g., roof) for the integrated device 301. Thus, the integrated passive device 203 (e.g., IPD) is configured to provide several functionalities for the package 300. This configuration provides a very compact form factor with a reduced footprint. The package 200 may be coupled to a substrate, an interposer or a printed circuit board (PCB) through the plurality of solder interconnects 270 and the plurality of solder interconnects 370. Different implementations may have packages with different configurations of an integrated device and an integrated passive device.

Figure 4:
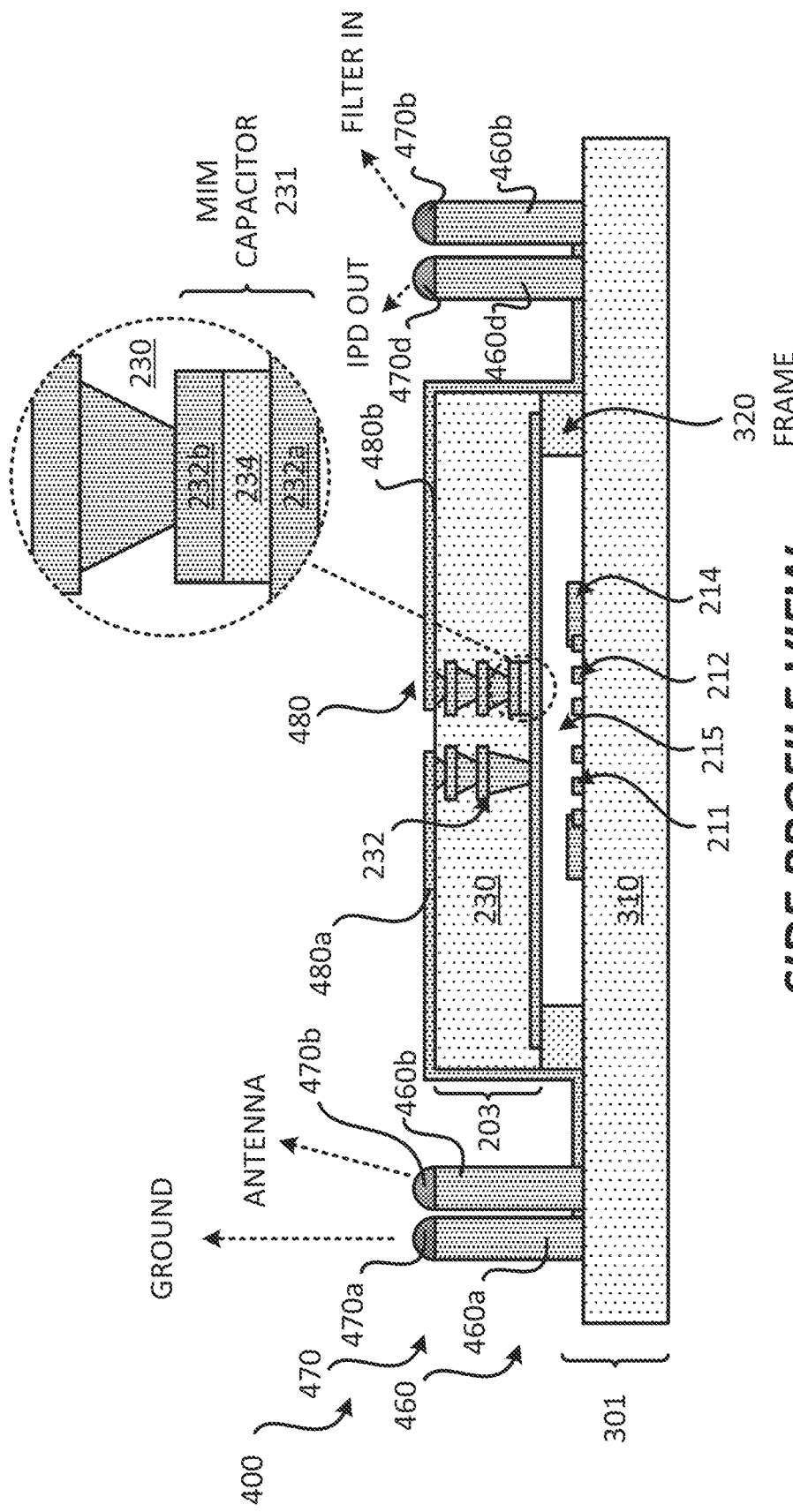
FIG. 4 illustrates a profile view of a package that includes an integrated device configured as a signal filter, and an integrated passive device configured as a cap for the filter.

FIG. 4 illustrates a package 400 that includes a filter and an integrated passive device that is configured to be a cap for the filter. The package 400 includes the integrated device 301, the integrated passive device 203 and the frame 320. The integrated device 301 may be configured as a filter (e.g., acoustic filter, signal filter). The package 400 may be similar to the package 300, and thus may include similar or the same components as the package 300. The package 400 includes a plurality of pillar interconnects 460 and a plurality of solder interconnects 470.

The frame 320 is coupled to a first surface of the substrate 310. The frame 320 may be a polymer frame. The frame 320 may laterally surround the at least one transducer 212. The integrated passive device 203 is coupled to the integrated device 301 through the frame 320. The plurality of pillar interconnects 460 is coupled to the interconnects of the substrate 310. The plurality of solder interconnects 470 is coupled to the plurality of pillar interconnects 460.

The integrated passive device 203 is configured as a cap for the integrated device 301. The void 215 is located between the integrated device 301 and the integrated passive device 203. The integrated passive device 203 may be a substrate-less integrated passive device. The integrated passive device 203 includes at least one dielectric layer 230, the plurality of interconnects 232, the insulator layer 234, the plurality of interconnects 480 (e.g., 480a, 480b). The plurality of interconnects 480 may located over an outer surface of the integrated passive device 203. For example, the plurality of interconnects 480 may be located over an outer surface of the at least one dielectric layer 230. The plurality of interconnects 480 is coupled to the plurality of interconnects 232. The integrated passive device 203 includes a capacitor 231. The capacitor 231 may be a metal-insulator-metal (MIM) capacitor, as described in FIG. 2.

As shown in FIG. 4, the integrated device 301 may be configured to be coupled to a ground solder interconnect 470a through the pillar interconnect 460a. For example, the at least one transducer 212 may be coupled to the ground solder interconnect 470a through the plurality of interconnects 214 and the pillar interconnect 460a. The integrated device 301 may be configured to be electrically coupled to other components of an electronic device through a filter in solder interconnect 470b and a pillar interconnect 460b. For example, the at least one transducer 212 may be configured to be electrically coupled to the filter in solder interconnect 470b through the plurality of interconnects 214 and the pillar interconnects 460b. The integrated passive device 203 may be configured to be coupled to an antenna through an interconnect 480a, a pillar interconnect 460c and an antenna solder interconnect 470c. The capacitor 231 of the integrated passive device 203 may be configured to be coupled to other components of an electronic device through an interconnect 480b, a pillar interconnect 460d and an IPD out solder interconnect 470d. The integrated device 301 may be configured to be electrically coupled to the integrated passive device 203 through the interconnect 480 (e.g., outer surface interconnect).

Figure 5:
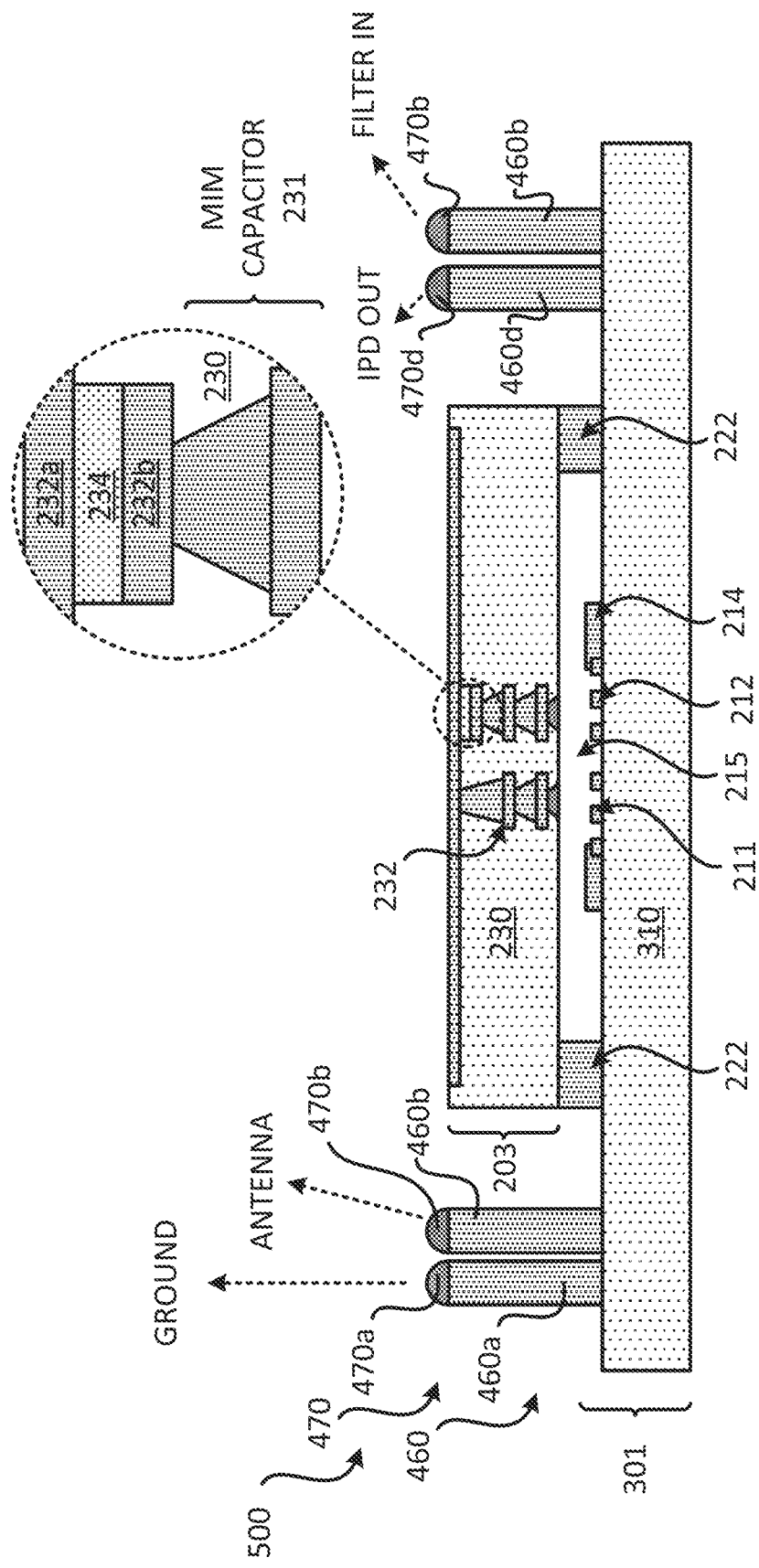
FIG. 5 illustrates a profile view of a package that includes an integrated device configured as a signal filter, and an integrated passive device configured as a cap for the filter.

FIG. 5 illustrates a package 500 that includes a filter and an integrated passive device that is configured to be a cap for the filter. The package 500 includes the integrated device 301, the integrated passive device 203 and the interconnects 222. The integrated device 301 may be configured as a filter (e.g., acoustic filter, signal filter). The package 500 may be similar to the package 400, and thus may include similar or the same components as the package 400. FIG. 5 illustrates that the integrated passive device 203 is coupled to the interconnects 222 such that the integrated passive device 203 is flipped upside down (when compared to the integrated passive device 203 of the package 400). The package 500 includes a plurality of pillar interconnects 460 and a plurality of solder interconnects 470.

As shown in FIG. 5, the integrated device 301 may be configured to be coupled to a ground solder interconnect 470*a* through the pillar interconnect 460*a*. For example, the at least one transducer 212 may be coupled to the ground solder interconnect 470*a* through the plurality of interconnects 214 and the pillar interconnect 460*a*. The integrated device 301 may be configured to be electrically coupled to other components of an electronic device through a filter in solder interconnect 470*b* and a pillar interconnect 460*b*. For example, the at least one transducer 212 may be configured to be electrically coupled to the filter in solder interconnect 470*b* through the plurality of interconnects 214 and the pillar interconnects 460*b*. The integrated passive device 203 may be configured to be coupled to an antenna through the plurality of interconnects 232, the interconnect 222, the pillar interconnect 460*c* and the antenna solder interconnect 470*c*. The capacitor 231 of the integrated passive device 203 may be configured to be coupled to other components of an electronic device through the plurality of interconnects 232, the interconnect 222, the pillar interconnect 460*d* and the IPD out solder interconnect 470*d*.

Figure 6:
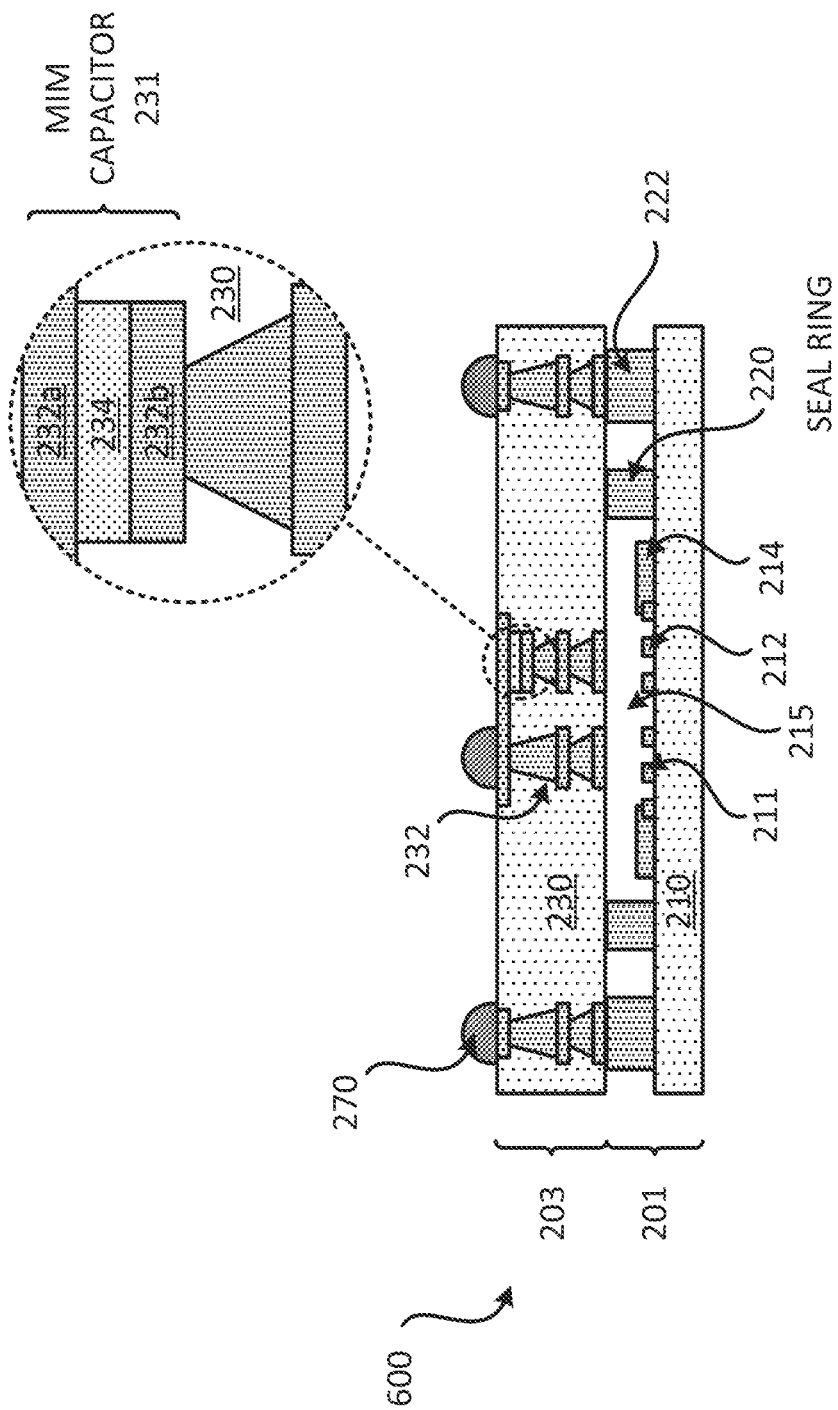
FIG. 6 illustrates a profile view of a package that includes an integrated device configured as a signal filter, and an integrated passive device configured as a cap for the filter.

FIG. 6 illustrates a package 600 that includes a filter and an integrated passive device that is configured to be a cap for the filter. The package 600 includes the integrated device 201, the integrated passive device 203, the seal ring 220 and the interconnects 222. The integrated device 201 may be configured as a filter (e.g., acoustic filter, signal filter). The package 600 may be similar to the package 200, and thus may include similar or the same components as the package 200. FIG. 6 illustrates that the integrated passive device 203 is coupled to the interconnects 222 and the seal ring 220 such that the integrated passive device 203 is flipped upside down (when compared to the integrated passive device 203 of the package 200). In the configuration of FIG. 6, the capacitor 231 is located to the frontside of the integrated passive device 203. The various components may be coupled in a similar manner as described in FIG. 2.

Figure 7:
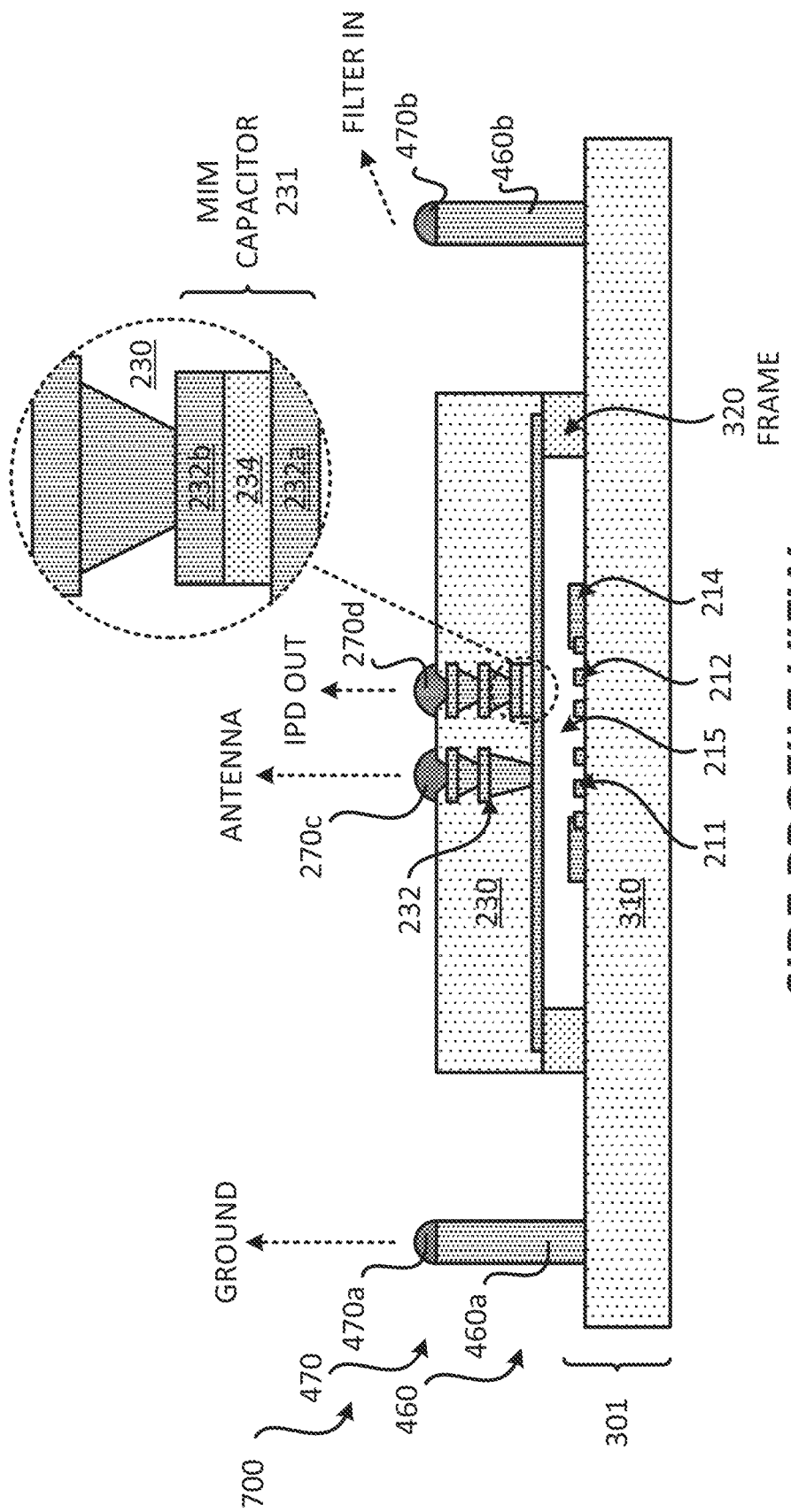
FIG. 7 illustrates a profile view of a package that includes an integrated device configured as a signal filter, and an integrated passive device configured as a cap for the filter.

FIG. 7 illustrates a package 700 that includes a filter and an integrated passive device that is configured to be a cap for the filter. The package 700 includes the integrated device 301, the integrated passive device 203, the seal ring 220 and the interconnects 222. The integrated device 301 may be configured as a filter (e.g., acoustic filter, signal filter). The package 700 may be similar to the package 300, and thus may include similar or the same components as the package 300. FIG. 7 illustrates that the integrated passive device 203 is coupled to the interconnects 222 and the seal ring 220 such that the integrated passive device 203 is flipped upside down (when compared to the integrated passive device 203 of the package 300). In the configuration of FIG. 7, the capacitor 231 is located to the frontside of the integrated passive device 203. The various components may be coupled in a similar manner as described in FIG. 2.

The integrated device 301 may be configured to be coupled to a ground solder interconnect 470*a* through the pillar interconnect 460*a*. For example, the at least one transducer 212 may be coupled to the ground solder interconnect 470*a* through the plurality of interconnects 214 and the pillar interconnect 460*a*. The integrated device 301 may be configured to be electrically coupled to other components of an electronic device through the pillar interconnect 460*b* and the filter in solder interconnect 470*b*. For example, the at least one transducer 212 may be configured to be electrically coupled to the filter in solder interconnect 470*b* through the plurality of interconnects 214 and the pillar interconnect 460*b*. The integrated passive device 203 may be configured to be coupled to an antenna through an antenna solder interconnect 270*c*. The capacitor 231 of the integrated passive device 203 may be configured to be coupled to other components of an electronic device through an IPD out solder interconnect 270*d*.

Figure 8:
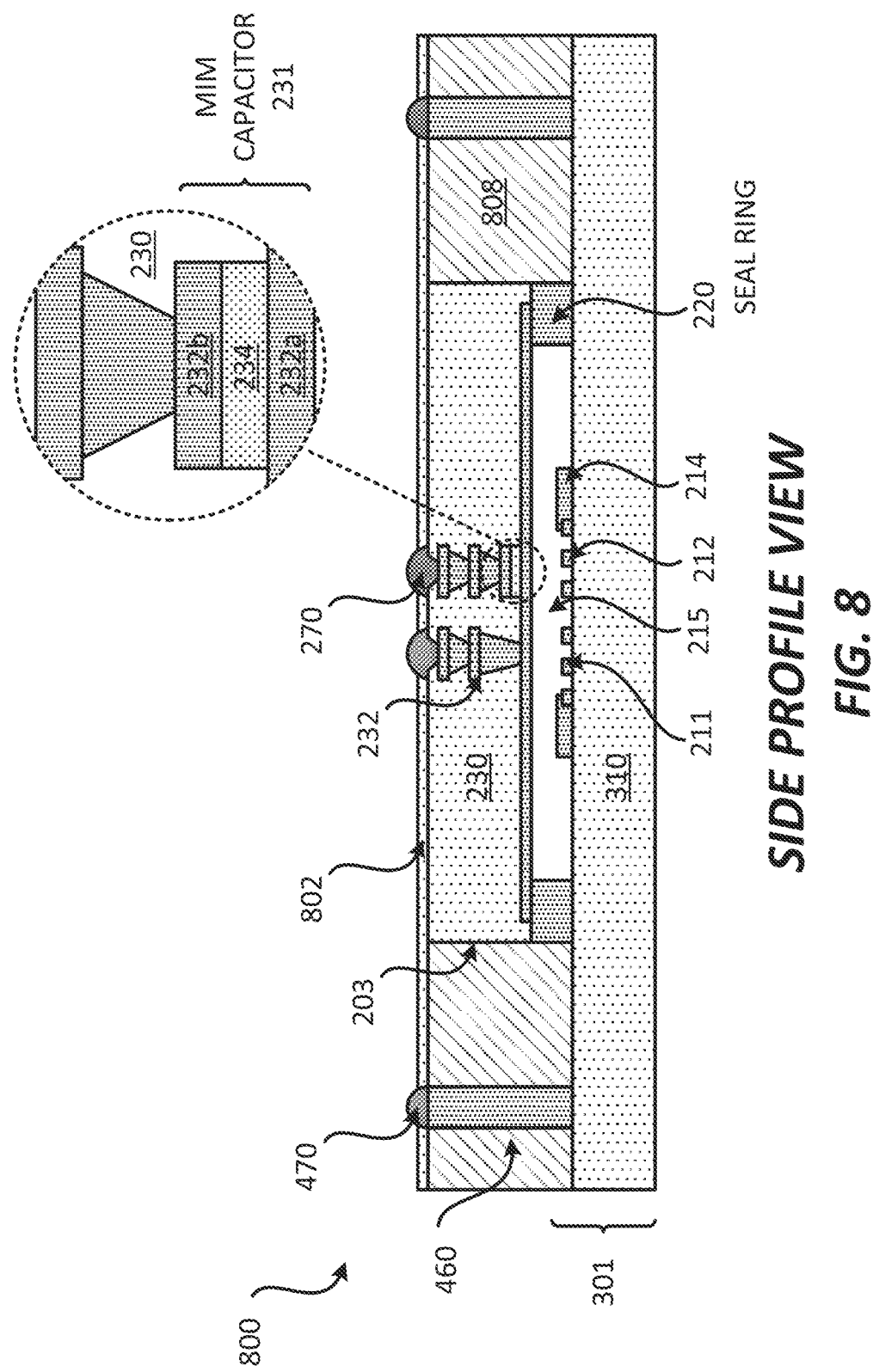
FIG. 8 illustrates a profile view of a package that includes an integrated device configured as a signal filter, and an integrated passive device configured as a cap for the filter.

FIG. 8 illustrates a package 800 that includes a filter and an integrated passive device that is configured to be a cap for the filter. The package 800 includes the integrated device 301, the integrated passive device 203, the seal ring 220, the interconnects 222, an encapsulation layer 808 and a passivation layer 802. The integrated device 301 may be configured as a filter (e.g., acoustic filter, signal filter). The package 800 may be similar to the package 700, and thus may include similar or the same components as the package 700. The various components of the package 800 may be coupled in a similar manner as described for the package 700 in FIG. 7. The encapsulation layer 808 may include a mold, a resin and/or an epoxy. The encapsulation layer 808 may be means for encapsulation. The encapsulation layer 808 may be located over and coupled to a surface of the substrate 310. The encapsulation layer 808 may encapsulate the plurality of pillar interconnects 460 and the integrated passive device 203. The void 215 may be located between the substrate 310 and the integrated passive device 203. A passivation layer 802 may be located over and coupled to the encapsulation layer 808 and the integrated passive device 203.

Figure 9:
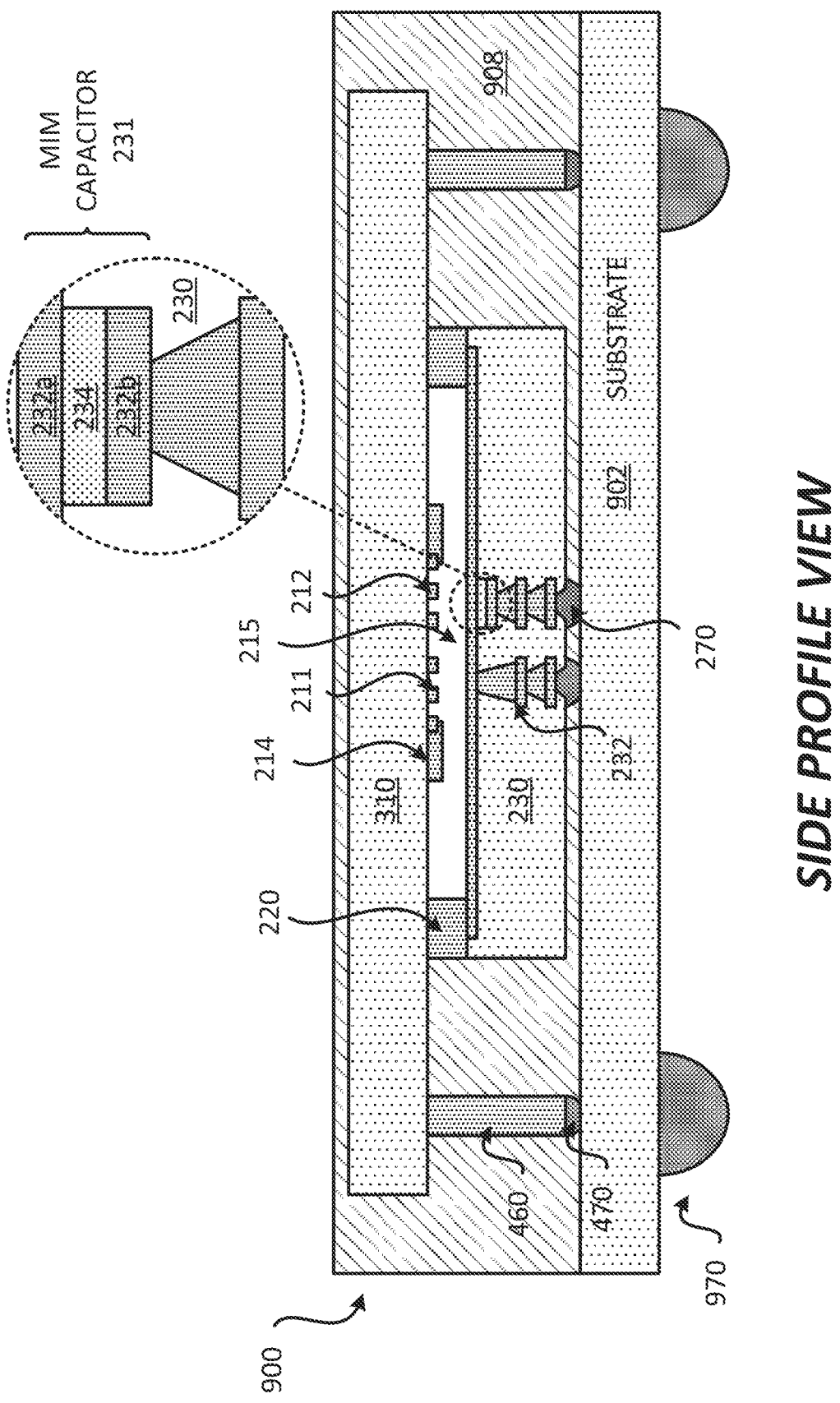
FIG. 9 illustrates a profile view of a package that includes an integrated device configured as a signal filter, and an integrated passive device configured as a cap for the filter.

FIG. 9 illustrates a package 900 that includes a filter and an integrated passive device that is configured to be a cap for the filter. The package 900 includes the integrated device 301, the integrated passive device 203, the seal ring 220, the interconnects 222, an encapsulation layer 808 and a substrate 902. The integrated device 301 may be configured as a filter (e.g., acoustic filter, signal filter). The package 900 may be similar to the package 800, and thus may include similar or the same components as the package 700. The various components of the package 900 may be coupled in a similar manner as described for the package 700 in FIG. 7 and/or the package 800 of FIG. 8. The encapsulation layer 808 may be located over and coupled to a surface of the substrate 902. The encapsulation layer 808 may encapsulate the plurality of pillar interconnects 460, the plurality of solder interconnects 470, the integrated passive device 203 and the integrated device 301. The void 215 may be located between the substrate 310 and the integrated passive device 203.

Figure 11:
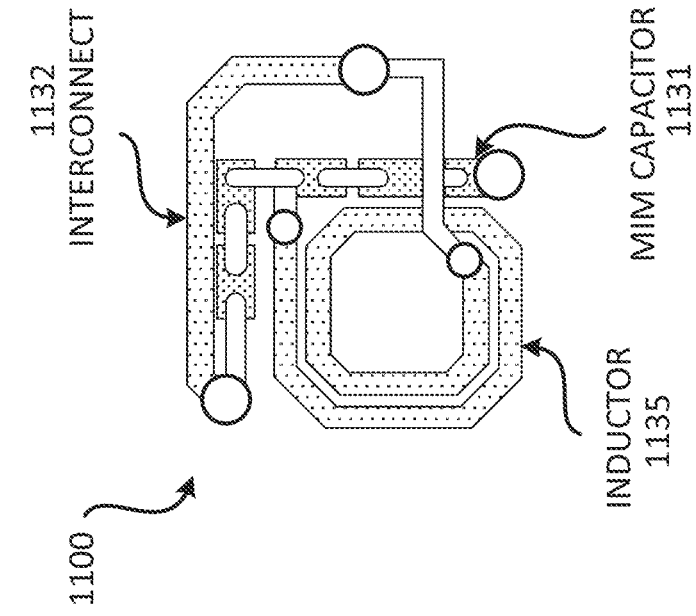
FIG. 11 illustrates a plan view of an integrated passive device configured as a cap for a filter.
Figure 10:
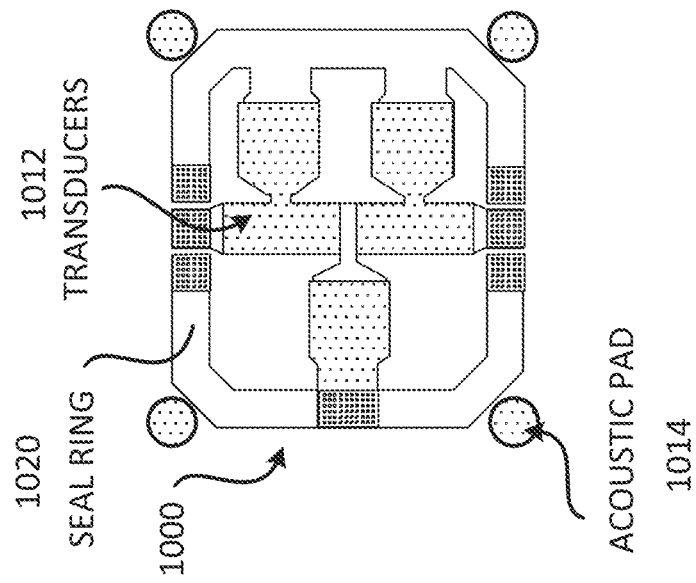
FIG. 10 illustrates a plan view of an integrated device configured as a signal filter.
Figure 12:
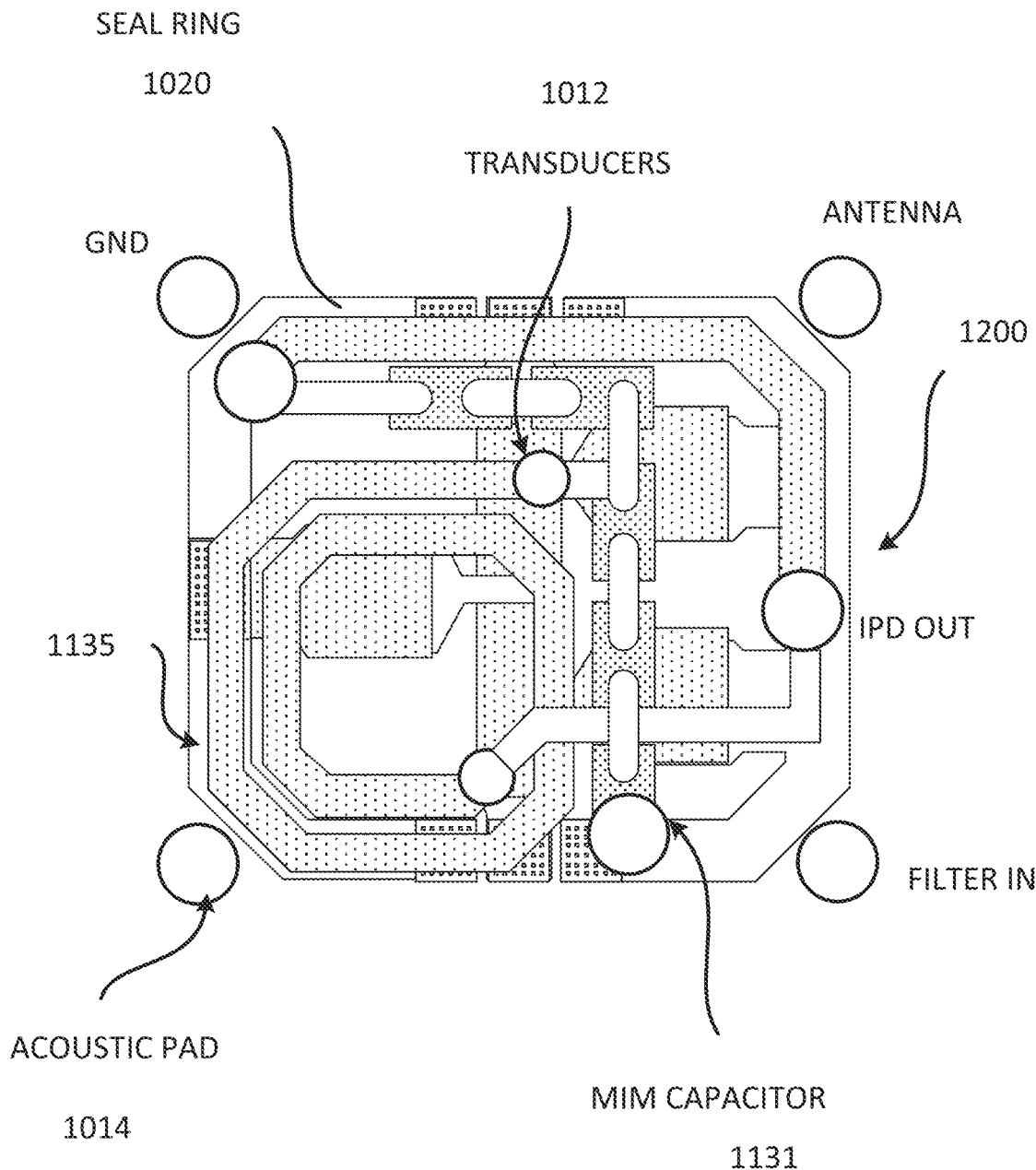
FIG. 12 illustrates a plan view of a package that includes an integrated device configured as a signal filter, and an integrated passive device configured as a cap for the filter.

FIGS. 10-12 illustrate plan views of an exemplary package that includes a filter and an integrated passive device configured as a cap for the filter. FIG. 10 illustrates a plan view of an integrated device 1000 that is configured as filter. The integrated device 1000 may represent any of filters and/or device configured as a filter described in the disclosure. The integrated device 1000 includes at least one transducer 1012, a seal ring 1020, and a plurality of interconnects 1014. The plurality of interconnects 1014 may be configured to operate as acoustic pads for ground and/or acoustic input/output (I/O) pads. The at least one transducer 1012 may correspond to the at least one transducer 212. The seal ring 1020 may correspond to the seal ring 220. The plurality of interconnects 1014 may correspond to the plurality of interconnects 214.

FIG. 11 illustrates a plan view of an integrated passive device 1100. The integrated passive device 1100 may represent any of integrated passive devices described in the disclosure (e.g., 203). The integrated passive device 1100 includes a plurality of interconnects 1132, the capacitor 1131 and the inductor 1135. The inductor 1135 is configured to be electrically coupled to the capacitor 1131. The plurality of interconnects may be located on one or more metal layers. The inductor 1135 may be defined from the plurality of interconnects 1132. The capacitor 1131 may be the capacitor 231.

FIG. 12 illustrates a plan view of the package 1200 that includes the integrated device 1000 and the integrated passive device 1100. The integrated device (e.g., 201, 301, 1000) may be means for acoustic filtering. The integrated passive device (e.g., 203, 1100) may be means for passive functionality. A capacitor may be a means for capacitance. An inductor may be a means for inductance.

FIGS. 2-12 illustrate examples of integrated devices that are similar or the same as the devices 101 and 103 of FIG. 1. However, the integrated devices (e.g., 201, 301) described in FIGS. 2-12 may be replaced with the devices 105 and/or 107 of FIG. 1. For example, the plurality of interconnects 214 (as described in FIGS. 2-14) may be coupled to the interconnects 152 and/or 154. Thus, the packages described in FIGS. 2-12 may be implemented to use any of filters and resonators described in the disclosure, including SAW filters and/or BAW filters.

Exemplary Sequence for Fabricating an Integrated Passive Device

In some implementations, fabricating an integrated passive device includes several processes. FIGS. 13A-13D illustrate an exemplary sequence for providing or fabricating n integrated passive device. In some implementations, the sequence of FIGS. 13A-13D may be used to provide or fabricate the integrated passive device 203 of FIG. 2. However, the process of FIGS. 13A-13D may be used to fabricate any of the integrated passive devices described in the disclosure.

It should be noted that the sequence of FIGS. 13A-13D may combine one or more stages in order to simplify and/or clarify the sequence for providing or fabricating an integrated passive device. In some implementations, the order of the processes may be changed or modified. In some implementations, one or more processes may be replaced or substituted without departing from the spirit of the disclosure.

Stage 1, as shown in FIG. 13A, illustrates a state after a substrate 1300 is provided. The substrate 1300 may include glass, silicon. LiNbO$_3$, quartz, and/or sapphire.

Stage 2 illustrates a state after a plurality of interconnects 1311 (e.g., first metal layer, M1) is formed over a first surface of the substrate 1300. The plurality of interconnects 1311 may be a patterned metal layer. A patterning process and a plating process may be used to form the plurality of interconnects 1311. Part of the plurality of interconnects 1311 may form a portion of a capacitor (e.g., 231). For example, part of the plurality of interconnects 1311 may form the interconnect 232a.

Stage 3 illustrates a state after an insulator layer 234 is formed over a portion of the plurality of interconnects 1311. A deposition process may be used to disposed the insulator layer 234 over a portion of the plurality of interconnects 1311. The insulator layer 234 may be formed over a portion of the plurality of interconnects 1311 that forms the interconnects 232a. The insulator layer 234a may include a high k dielectric layer. The insulator layer 234 may include nitride, silicon nitride, Al$_2$O$_3$, and/or similar materials.

Stage 4 illustrates a state after at least one interconnect 1315 (e.g., second metal layer, M2) is formed over the insulator layer 234. The at least one interconnect 1315 may be a patterned metal layer. A patterning process and a plating process may be used to form the at least one interconnect 1315. At least part of the at least one interconnect 1315 may form the interconnect 232b. In some implementations, part of the at least one interconnect 1311, the insulator layer 234, and at least part of the at least one interconnect 1315 may form the capacitor 231, as described in at least FIG. 2.

Stage 5 illustrates a state after a dielectric layer 1320 is formed over the substrate 1300, the plurality of interconnects 1311, the insulator layer 234 and the at least one interconnect 1315. A deposition process may be used to form the dielectric layer 1320. The dielectric layer 1320 may be different than the insulator layer 234. The dielectric layer 1320 may include polyimide (PE).

Figure 13B:
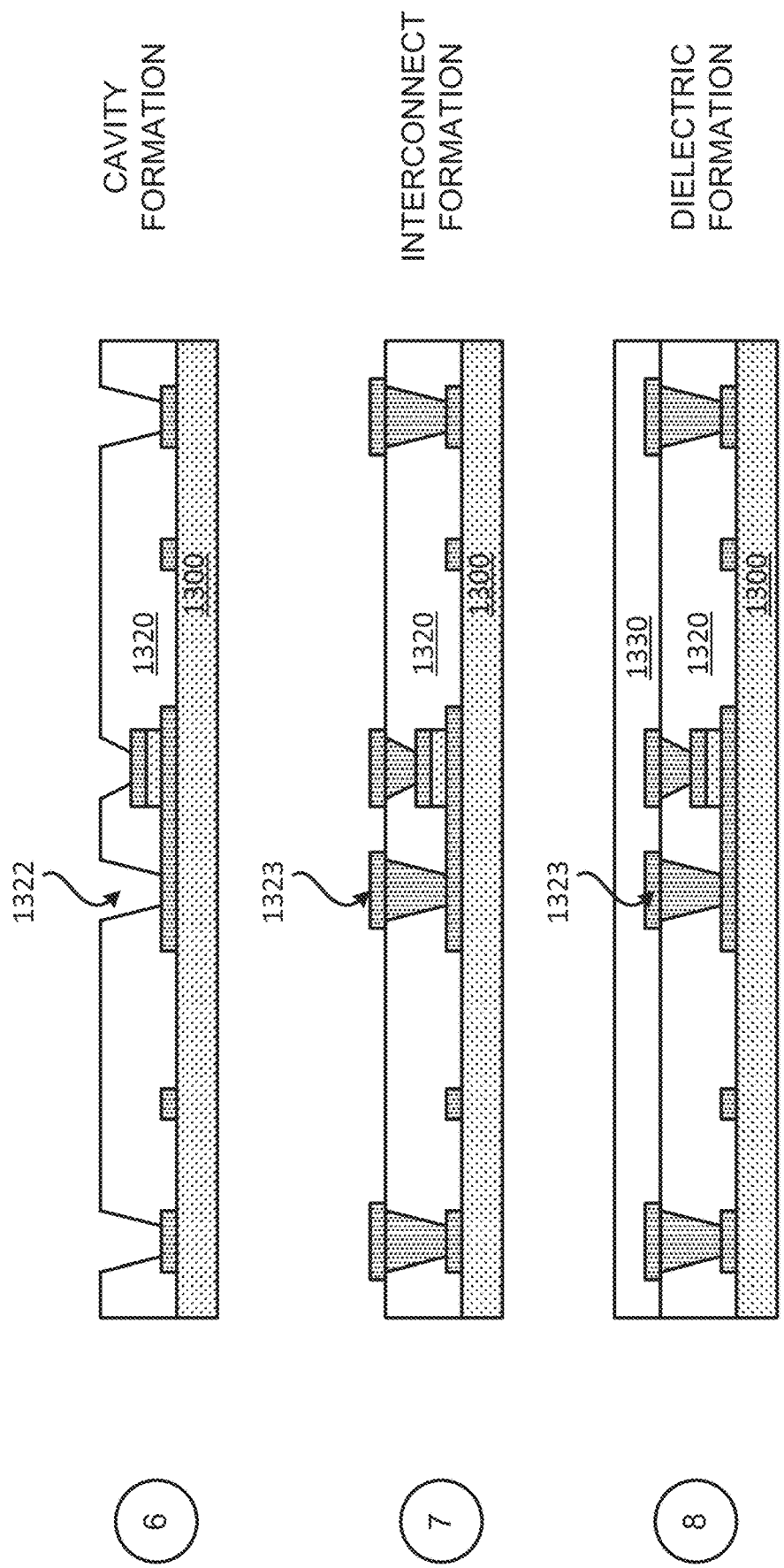

Stage 6, as shown in FIG. 13B, illustrates a state after at least one cavity 1322 is formed in the dielectric layer 1320. A laser process (e.g., laser ablation), a lithography process (e.g., exposure and development), and/or an etching process may be used to form the cavity 1322.

Stage 7 illustrates a state after a plurality of interconnects 1323 are formed in and over the at least one cavity 1322 and over the surface of the dielectric layer 1320. A patterning process and a plating process may be used to form the interconnects 1323. Some of the interconnects 1323 may be on a third metal layer (M3). At least one of the interconnects 1323 may be coupled to the capacitor 231.

Stage 8 illustrates a state after a dielectric layer 1330 is formed over the dielectric layer 1320 and the interconnects 1323. A deposition process may be used to form the dielectric layer 1330. The dielectric layer 1330 may include polyimide (PE).

Figure 13C:
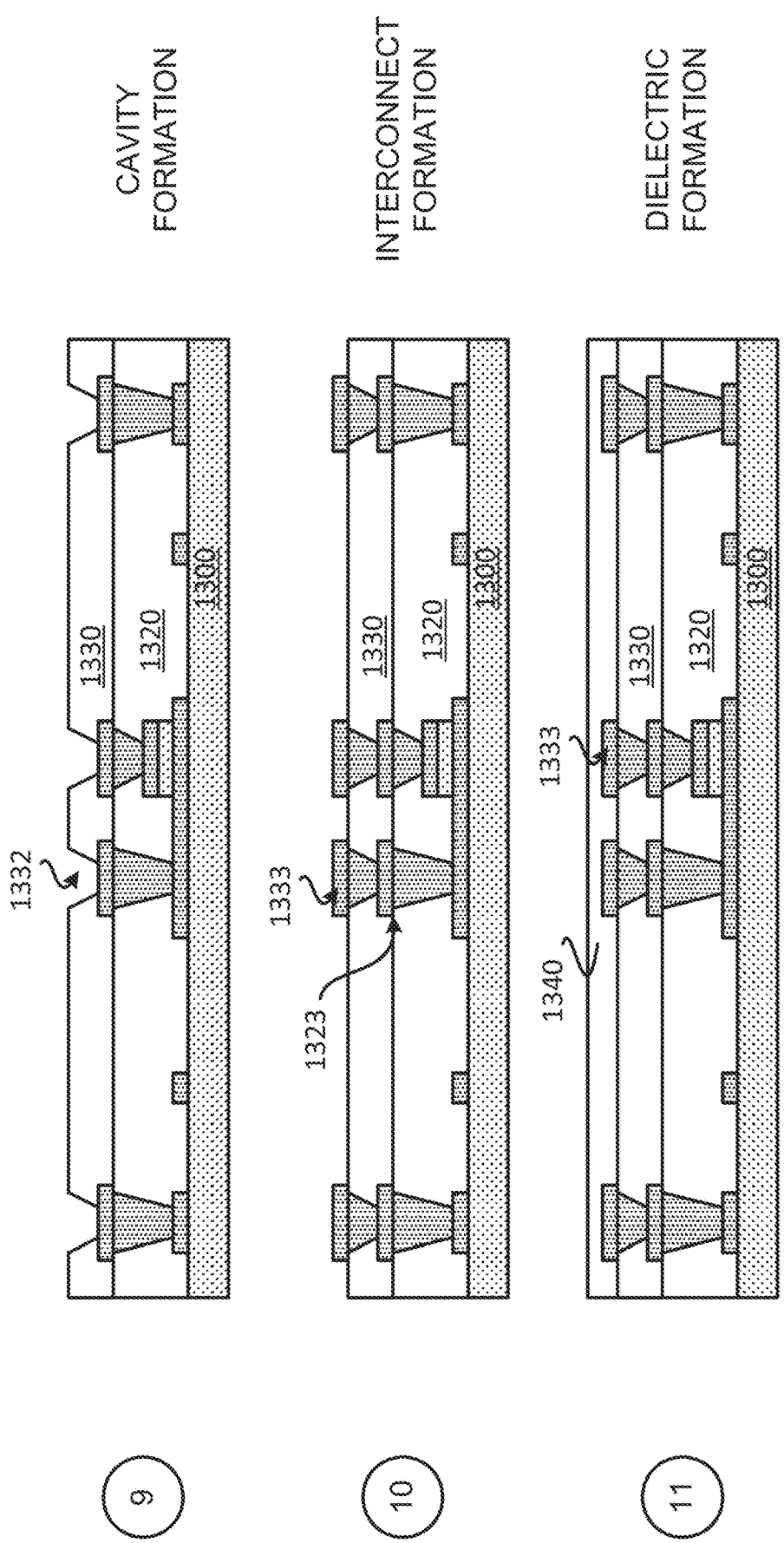

Stage 9, as shown in FIG. 13C, illustrates a state after at least one cavity 1332 is formed in the dielectric layer 1330. A laser process (e.g., laser ablation), a lithography process (e.g., exposure and development), and/or an etching process may be used to form the cavity 1332.

Stage 10 illustrates a state after a plurality of interconnects 1333 are formed in and over the at least one cavity 1332 and over the surface of the dielectric layer 1330. A patterning process and a plating process may be used to form the interconnects 1333. Some of the interconnects 1333 may be on a third metal layer (M4).

Stage 11 illustrates a state after a dielectric layer 1340 is formed over the dielectric layer 1330 and the interconnects 1333. A deposition process may be used to form the dielectric layer 1340. The dielectric layer 1340 may include polyimide (PE).

Figure 13D:
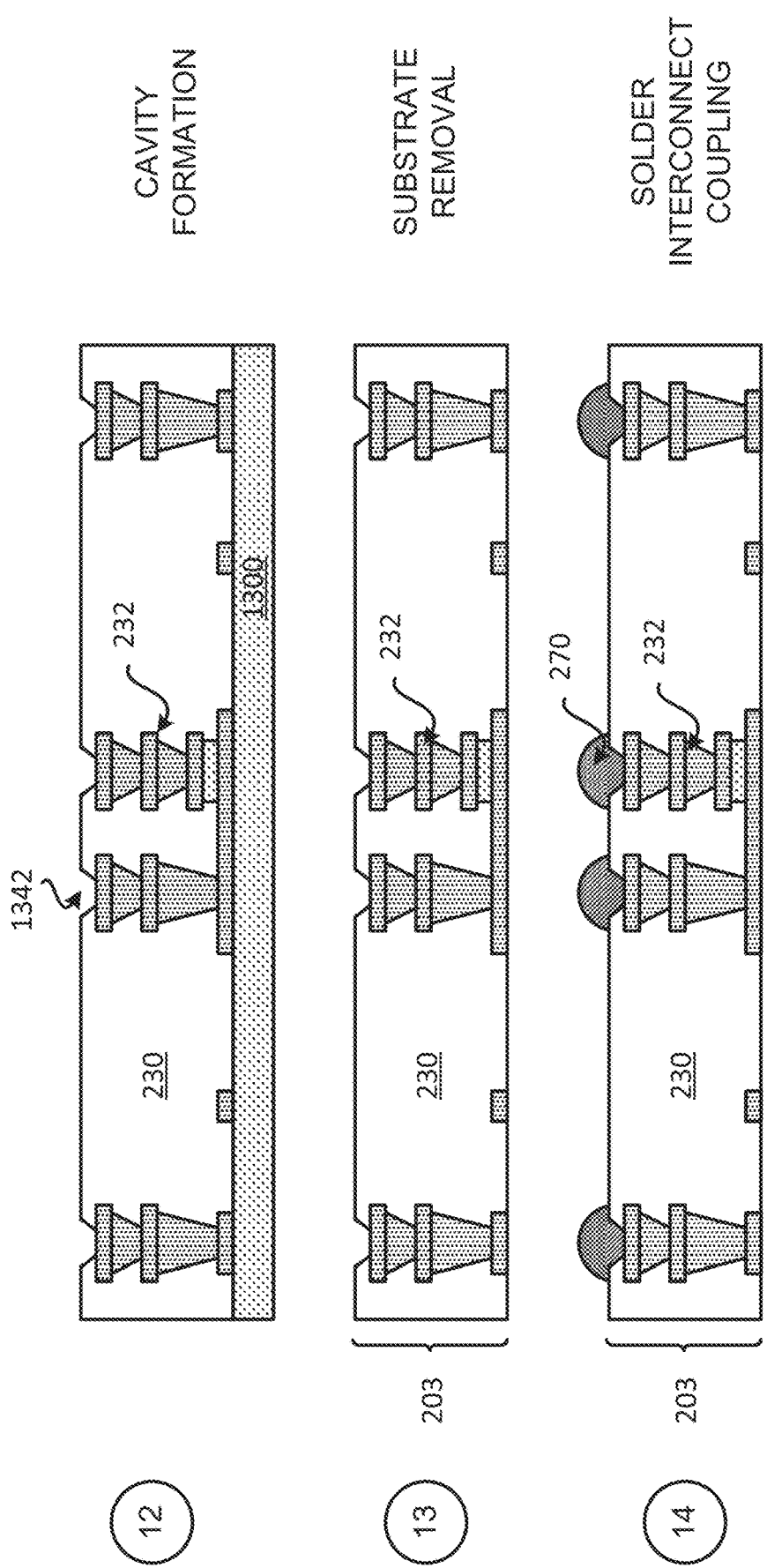

Stage 12, as shown in FIG. 13D, illustrates a state after at least one cavity 1342 is formed in the at least one dielectric layer 230. The at least one dielectric layer 230 may represent the dielectric layers 1320, 1330 and/or 1340. A laser process (e.g., laser ablation), a lithography process (e.g., exposure and development), and/or an etching process may be used to form the cavity 1342. Stage 12 illustrates the plurality of interconnects 232 which may represent the plurality of interconnects 1311, 1315, 1323, and/or 1333.

Stage 13 illustrates a state after the substrate 1300 has been removed from the at least one dielectric layer 230, leaving a substrate less integrated passive device 203. Different implementations may remove the substrate 1300 differently. For example, the substrate 1300 may be remove through a photonic process, a thermal process, a chemical process and/or a mechanical process. Examples of how the substrate 1300 may be removed are illustrated and described below in at least FIGS. 14 and 15.

Stage 14 illustrates a state after a plurality of solder interconnects 270 is coupled to the integrated passive device 203. A reflow process may be used to couple the plurality of solder interconnects 270 to the plurality of interconnects 232.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Sequence for Fabricating an Integrated Passive Device

Figure 14:
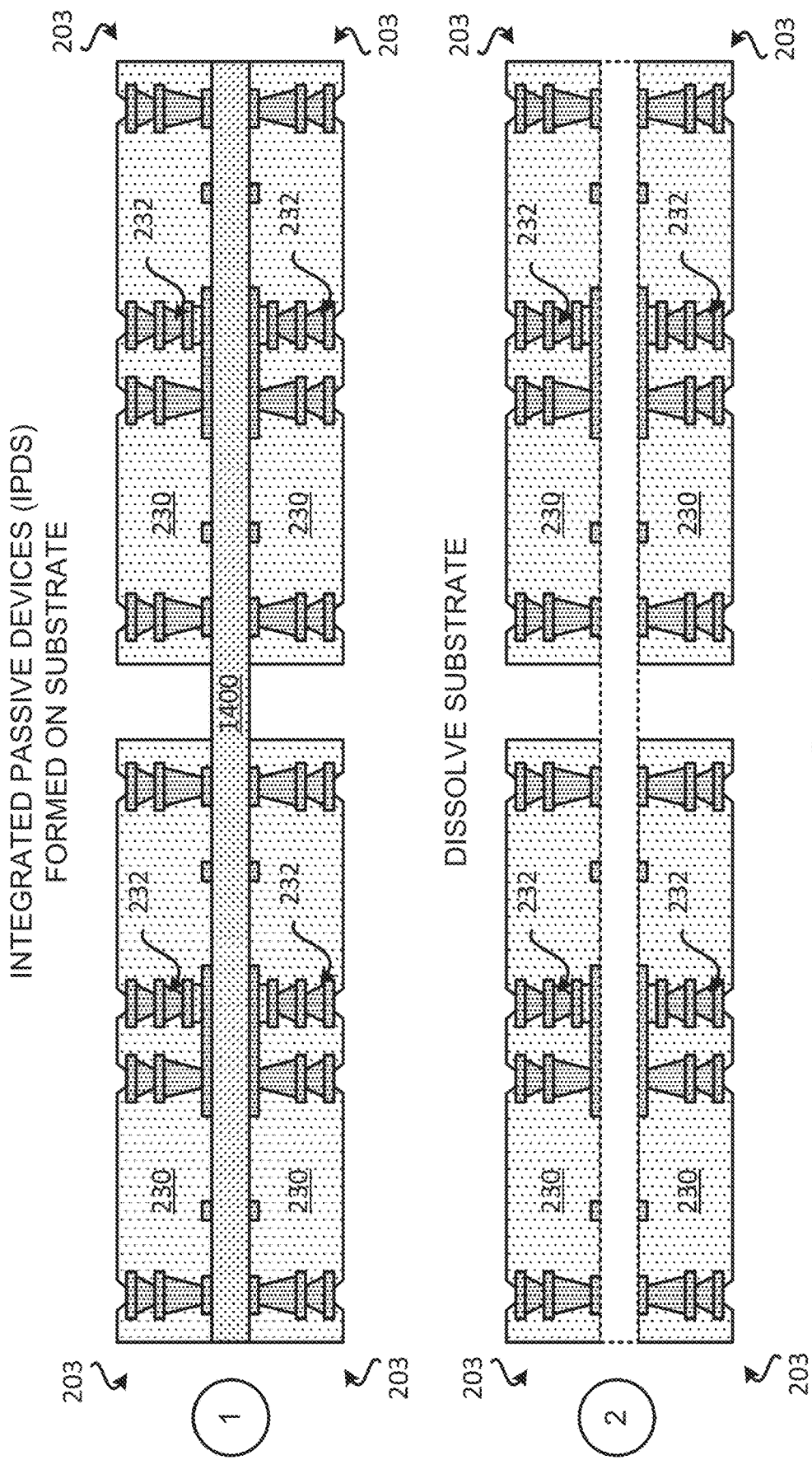
FIG. 14 illustrates an exemplary sequence for fabricating an integrated passive device configured as a cap for a filter.

As mentioned above, the integrated passive devices may be initially formed over a substrate and the substrate is subsequently removed. FIGS. 14 and 15 illustrates examples of how a substrate may be removed and/or separated from integrated passive devices.

FIG. 14 illustrates an example of how a substrate may be separated from integrated passive devices. Stage 1 of FIG. 14 illustrates a plurality of integrated passive devices 203 that are formed over a first surface of the substrate 1400 and over a second surface of the substrate 1400. The plurality of integrated passive devices 203 may be fabricated using the process described in at least FIG. 13A-13D. The substrate 1400 may be the substrate 1300 as described in FIGS. 13A-13D. The substrate 1400 may include glass and/or any material as described in FIG. 13.

Stage 2 illustrates a state after vapors of hydrofluoric acid (HF) is used to dissolve the substrate 1400, which then frees up the individual integrated passive devices 203. In some implementations, a buffered HF with SiN protection layer may be used to dissolve the substrate 1400.

FIG. 15 illustrates another example of how a substrate may be separated from integrated passive devices. The substrate shown FIG. 15 may include a silicon sacrificial coating layer. Stage 1 of FIG. 15 illustrates a plurality of integrated passive devices 203 that are formed over a first surface of a sacrificial coating layer 1510 of the substrate 1400 and over a second surface of a sacrificial coating layer 1510 of the substrate 1400. The plurality of integrated passive devices 203 may be fabricated using the process described in at least FIG. 13A-13D. The substrate 1400 may be the substrate 1300 as described in FIGS. 13A-13D. The substrate 1400 may include glass and/or any material as described in FIG. 13. The substrate 1400 may be covered (e.g., coated) with the sacrificial coating layer 1510. The sacrificial coating layer 1510 may include silicon.

Stage 2 illustrates a state after xenon difluoride (XeF$_2$) is used to release the individual integrated passive devices 203 from the substrate 1400.

It is noted that different implementations may use different processes and/or different materials and/or chemicals to remove and/or release the substrate from the integrated passive devices 203.

Figure 16A:
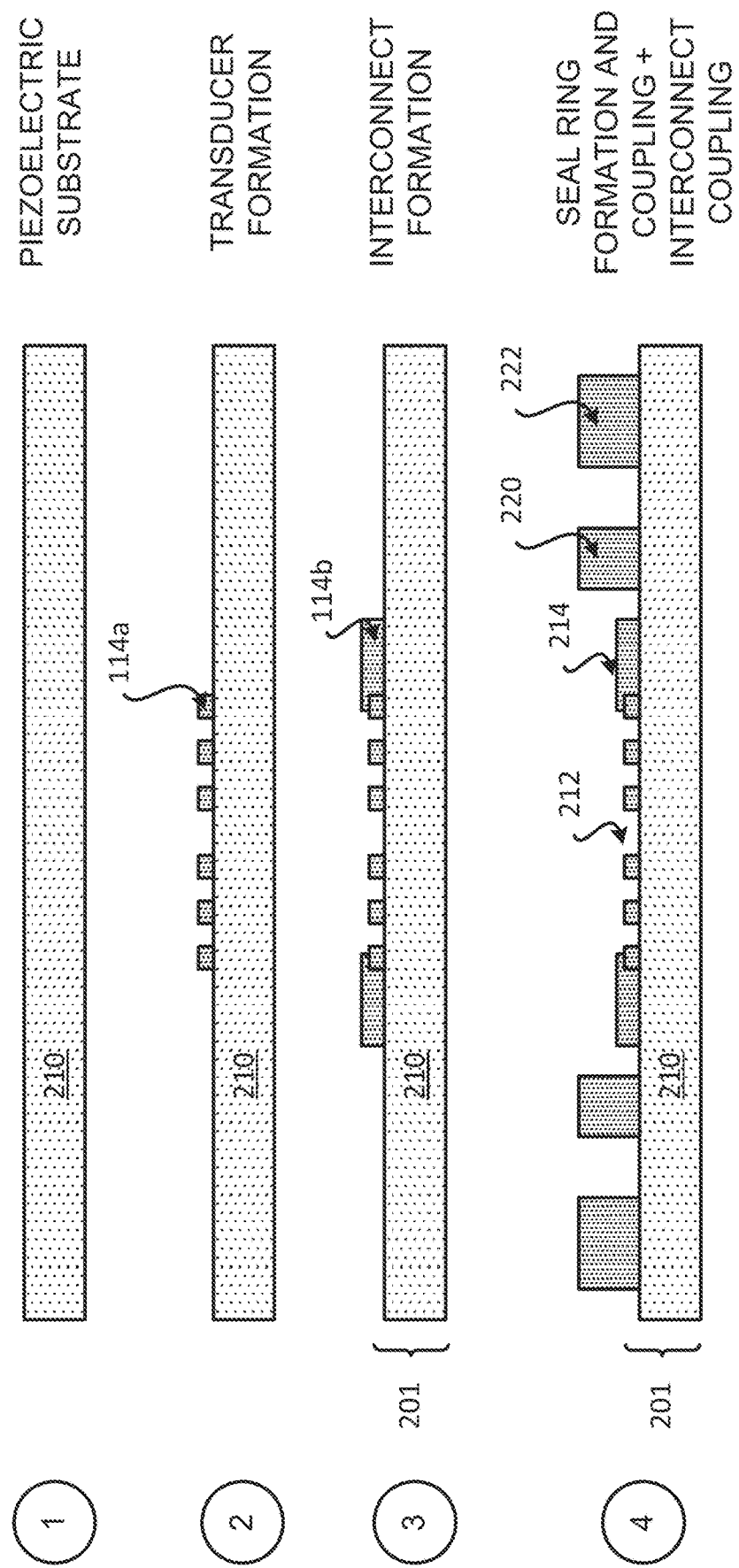
FIG. 16A-16B illustrate an exemplary sequence for fabricating a package that includes an integrated device configured as a signal filter, and an integrated passive device configured as a cap for the filter.
Figure 16B:
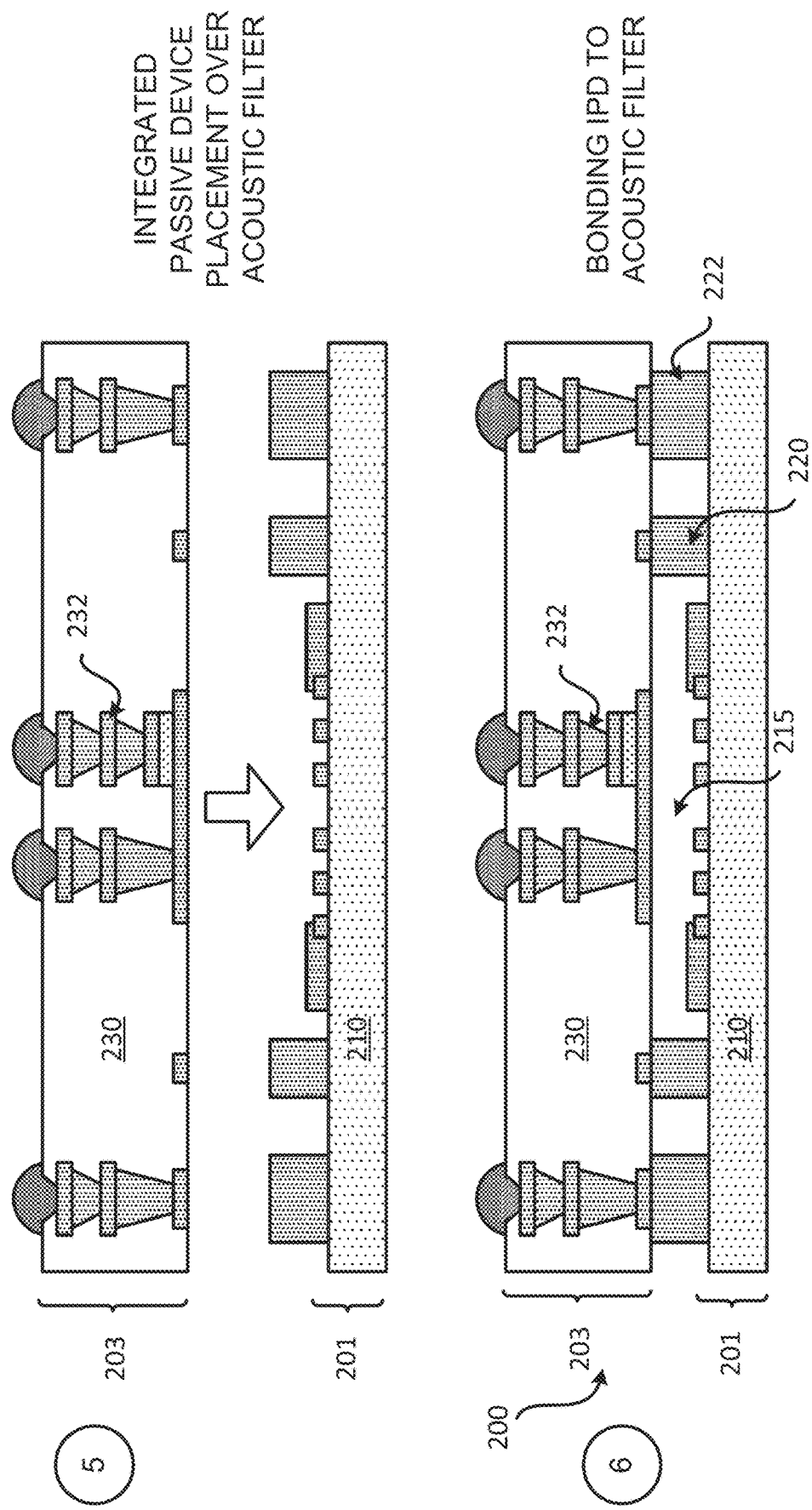

Exemplary Sequence for Fabricating a Package Comprising an Integrated Device and an Integrated Passive Device Configured as a Cap for the Integrated Device In some implementations, fabricating a package includes several processes. FIGS. 16A-16B illustrate an exemplary sequence for providing or fabricating a package. In some implementations, the sequence of FIGS. 16A-16B may be used to provide or fabricate the package 200 of FIG. 2. However, the process of FIGS. 16A-16B may be used to fabricate any of the packages described in the disclosure.

It should be noted that the sequence of FIGS. 16A-16B may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure.

Stage 1, as shown in FIG. 16A, illustrates a state after a substrate 210 is provided. The substrate 210 may be a piezoelectric substrate. The substrate 210 may include a piezoelectric material. In some implementations, the substrate 210 may include a piezoelectric layer that is formed and located over a first surface (e.g., top surface) of the substrate 210. For example, the substrate 210 may include glass with a piezoelectric layer formed and located over a first surface of the glass. Other materials may be used instead of glass. Different implementations may use different material may be used for the piezoelectric material (e.g., Aluminum Nitride (AlN), Lithium Niobate, Lithium Tantalate). The entire substrate may be made of a piezoelectric material or only a portion of the substrate may include a piezoelectric material. For example, the substrate 210 may represent the piezoelectric substrate 110 or the piezoelectric substrate 130 (that includes the substrate 131 and the piezoelectric layer 132).

Stage 2 illustrates a state after a metal layer 114a (e.g., first metal layer) is formed over the first surface of the substrate 210. The metal layer 114a may be patterned to be configured as transducers (e.g. 212). A patterning and a plating process may be used to form the metal layer 114a.

Stage 3 illustrates a state after a metal layer 114b (e.g., second metal layer) is formed over the first surface of the substrate 210. The metal layer 114b may be patterned to be configured as interconnects (e.g. 214). A patterning and a plating process may be used to form the metal layer 114b. The metal layer 114b may be formed such that the metal layer 114b is coupled to the metal layer 114a. For example, the interconnects 214 may be formed over the substrate 210 such that the interconnects 214 are coupled to the at least one transducer 212. Stage 3 may illustrate an integrated device 201 that is configured to operate as a filter (e.g., acoustic filter, signal filter). It is noted that Stages 1-3 may be used and/or modified to fabricate the devices 105 and 107. For example, some of the processes described in Stages 1-3 may be repeated to form the additional metal layers of the devices 105 and 107.

It is noted Stages 2 and 3 may be combined. In some implementations, the transducers and interconnects are formed on the same metal layer or part of the same metal layer (e.g., 114). It is further noted that the metal layers (e.g., 114a, 114b, 114) may be form and define other components.

Stage 4 illustrates a state after a seal ring 220 and interconnects 222 are coupled to the substrate 210. The seal ring 220 may include a metal, such as copper. The seal ring 220 may laterally surround the transducer 212. Different implementations may provide the seal ring 220 and/or the interconnects 222 to the substrate 210. The seal ring 220 may be bonded to the substrate 210. For example, the seal ring 220 may fabricated separately from the substrate 210 and then the seal ring 220 may be bonded to metal of the substrate 210. The interconnects 222 may be formed over or bonded to the substrate 210. The interconnects 222 may be coupled to the interconnects 214. The interconnects 222 may be pillar interconnects. The interconnects 222 may be provided through a sputtering process, a spray coating process, and/or a plating process.

Stage 5, as shown in FIG. 16B, illustrates a state as the integrated passive device 203 is placed over the integrated device 201. A pick and place process may be used to place the integrated passive device 203. The integrated passive device 203 may be placed such that the back side of the integrated passive device 203 faces a front side of the integrated device 201. The integrated passive device 203 may be placed such that the front side of the integrated passive device 203 faces a front side of the integrated device 201. An example of a process for fabricating the integrated passive device 203 is illustrated and described in at least FIGS. 13A-13D.

Stage 6 illustrates a state after the integrated passive device 203 is coupled (e.g., bonded) to the integrated device 201 through the seal ring 220 and the interconnects 222. A thermal compression process may be used to bond the integrated passive device 203 to the integrated device 201, resulting in the package 200 that includes a void 215 between the integrated device 201 and the integrated passive device 203.

Figure 17C:
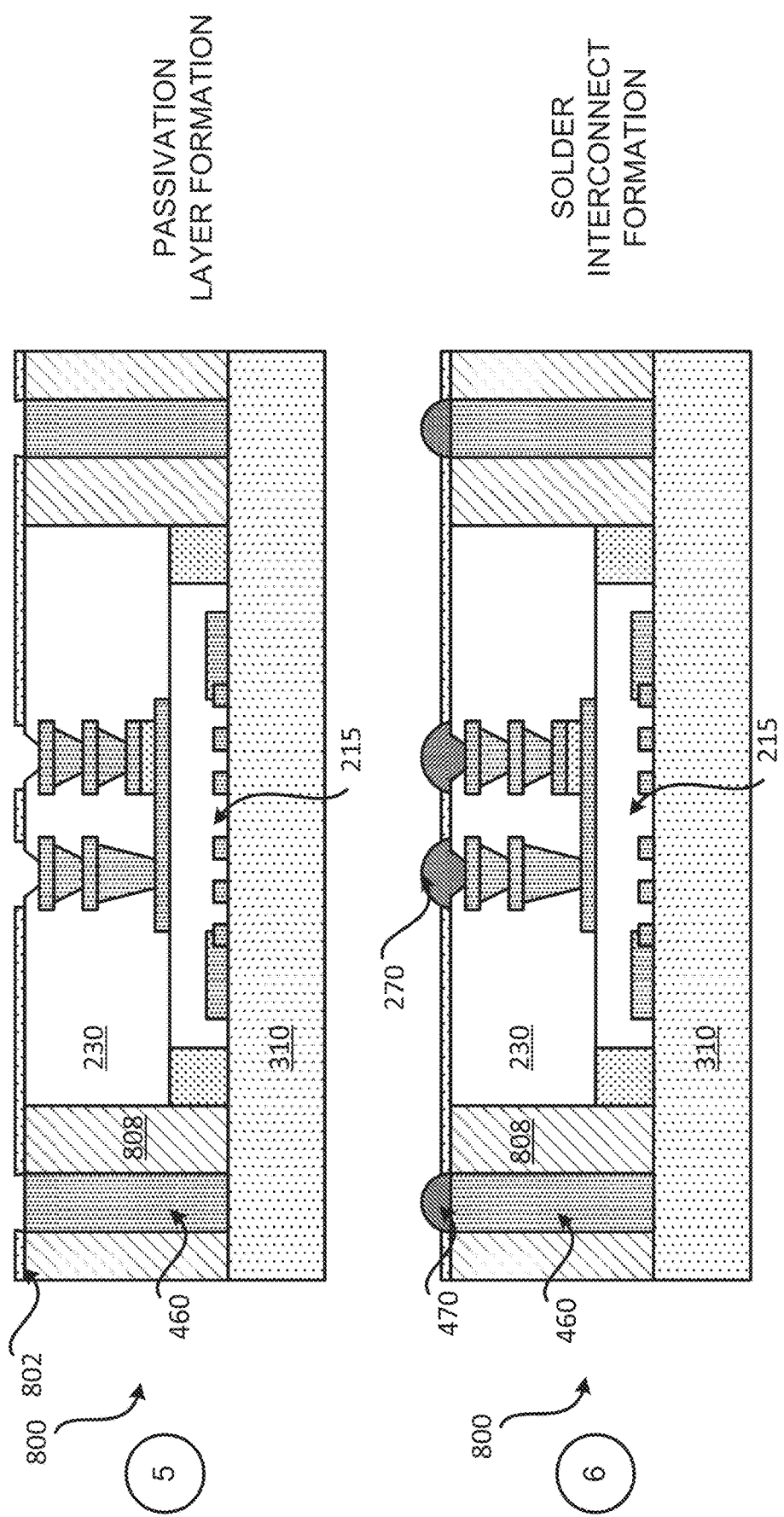

Exemplary Sequence for Fabricating a Package Comprising an Integrated Device and an Integrated Passive Device Configured as a Cap for the Integrated Device In some implementations, fabricating a package includes several processes. FIGS. 17A-17C illustrate an exemplary sequence for providing or fabricating a package. In some implementations, the sequence of FIGS. 17A-17C may be used to provide or fabricate the package 800 of FIG. 8. However, the process of FIGS. 17A-17C may be used to fabricate any of the packages described in the disclosure.

It should be noted that the sequence of FIGS. 17A-17C may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure.

Stage 1, as shown in FIG. 17A, illustrates a state as the integrated passive device 203 is placed over the integrated device 301. A pick and place process may be used to place the integrated passive device 203. The integrated passive device 203 may be placed such that the back side of the integrated passive device 203 faces a front side of the integrated device 301. The integrated passive device 203 may be placed such that the front side of the integrated passive device 203 faces a front side of the integrated device 301. The integrated device 301 includes the substrate 310, a frame 320 (e.g., polymer frame), at least one transducer 212 and a plurality of interconnects 214. An example of a process for fabricating the integrated passive device 203 is illustrated and described in at least FIGS. 13A-13D. An example of a process for fabricating an integrated device is illustrated and described in at least FIG. 16A.

Stage 2 illustrates a state after the integrated passive device 203 is coupled (e.g., bonded) to the integrated device 301 through the frame 320. A thermal compression process may be used to bond the integrated passive device 203 to the integrated device 301, resulting in a void 215 between the integrated device 301 and the integrated passive device 203.

Stage 3, as shown in FIG. 17B, illustrates a state after a plurality of pillar interconnects 460 is coupled to the integrated device 301. Different implementations may provide the plurality of pillar interconnects 460 differently. The plurality of pillar interconnects 460 may be coupled to the plurality of interconnects 214.

Stage 4 illustrates a state after the encapsulation layer 808 is formed over and coupled to the substrate 310. The encapsulation layer 808 may include a mold, a resin and/or an epoxy. The encapsulation layer 808 may be means for encapsulation. A compression and transfer molding process, a sheet molding process, or a liquid molding process may be used to form the encapsulation layer 808. The encapsulation layer 808 may be photo etchable. The encapsulation layer 808 may encapsulate the plurality of pillar interconnects 460 and the integrated passive device 203

Stage 5, as shown in FIG. 17C, illustrates a state after a passivation layer 802 is formed over the encapsulation layer 808 and the integrated passive device 203. A deposition process may be used to form the passivation layer 802. Stage 5 may illustrate a package 800 that includes the integrated device 301 and the integrated passive device 203.

Stage 6 illustrates a state after a plurality of solder interconnects 270 is coupled to the integrated passive device 203 and a plurality of solder interconnects 470 is coupled to the plurality of pillar interconnects 460. A reflow solder process may be used to couple the plurality of solder interconnects 270 to the integrated passive device 203 and the plurality of solder interconnects 470 to the plurality of pillar interconnects 460.

Figure 18A:
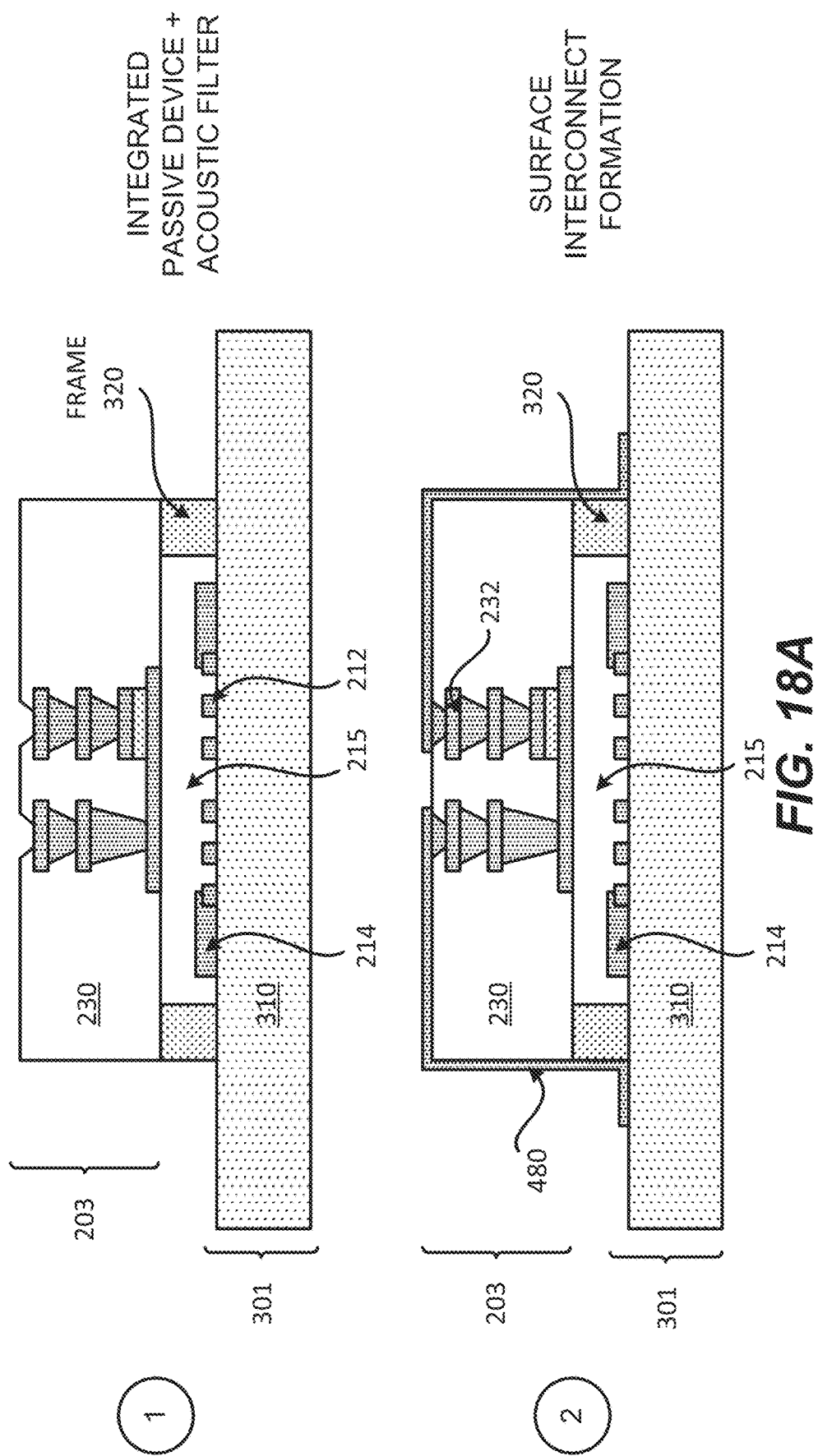

Exemplary Sequence for Fabricating a Package Comprising an Integrated Device and an Integrated Passive Device Configured as a Cap for the Integrated Device In some implementations, fabricating a package includes several processes. FIGS. 18A-18B illustrate an exemplary sequence for providing or fabricating a package. In some implementations, the sequence of FIGS. 18A-18B may be used to provide or fabricate the package 400 of FIG. 4. However, the process of FIGS. 18A-18B may be used to fabricate any of the packages described in the disclosure.

It should be noted that the sequence of FIGS. 18A-18B may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure.

Stage 1, as shown in FIG. 18A, illustrates a state after the integrated passive device 203 is coupled (e.g., bonded) to the integrated device 301 through the frame 320. A thermal compression process may be used to bond the integrated passive device 203 to the integrated device 301, resulting in a void 215 between the integrated device 301 and the integrated passive device 203. The integrated passive device 203 may be coupled such that the back side of the integrated passive device 203 faces a front side of the integrated device 301. The integrated passive device 203 may be coupled such that the front side of the integrated passive device 203 faces a front side of the integrated device 301. The integrated device 301 includes the substrate 310, a frame 320 (e.g., polymer frame), at least one transducer 212 and a plurality of interconnects 214. An example of a process for fabricating the integrated passive device 203 is illustrated and described in at least FIGS. 13A-13D. An example of a process for fabricating an integrated device is illustrated and described in at least FIG. 16A.

Stage 2 illustrates a state after a plurality of interconnects 480 is formed over a surface of the integrate passive device 203 and the substrate 310. The plurality of interconnects 480 may also be formed over a side surface of the frame 320. A sputtering process, a spray coating, and/or a plating process may be used to form the interconnects 480. The plurality of interconnects 480 may be coupled to the plurality of interconnects 232 and/or the plurality of interconnects 214.

Stage 3, as shown in FIG. 18B, illustrates a state after a plurality of pillar interconnects 460 is coupled to the integrated device 301. Different implementations may provide the plurality of pillar interconnects 460 differently. The plurality of pillar interconnects 460 may be coupled to the plurality of interconnects 214. The plurality of pillar interconnects 460 may be coupled to the plurality of interconnects 480.

Stage 4 illustrates a state after a plurality of solder interconnects 470 is coupled to the plurality of pillar interconnects 460. A reflow process may be used to couple the plurality of solder interconnects 470 to the plurality of pillar interconnects 460. Stage 4 may illustrate the package 400 of FIG. 4.

Figure 19:
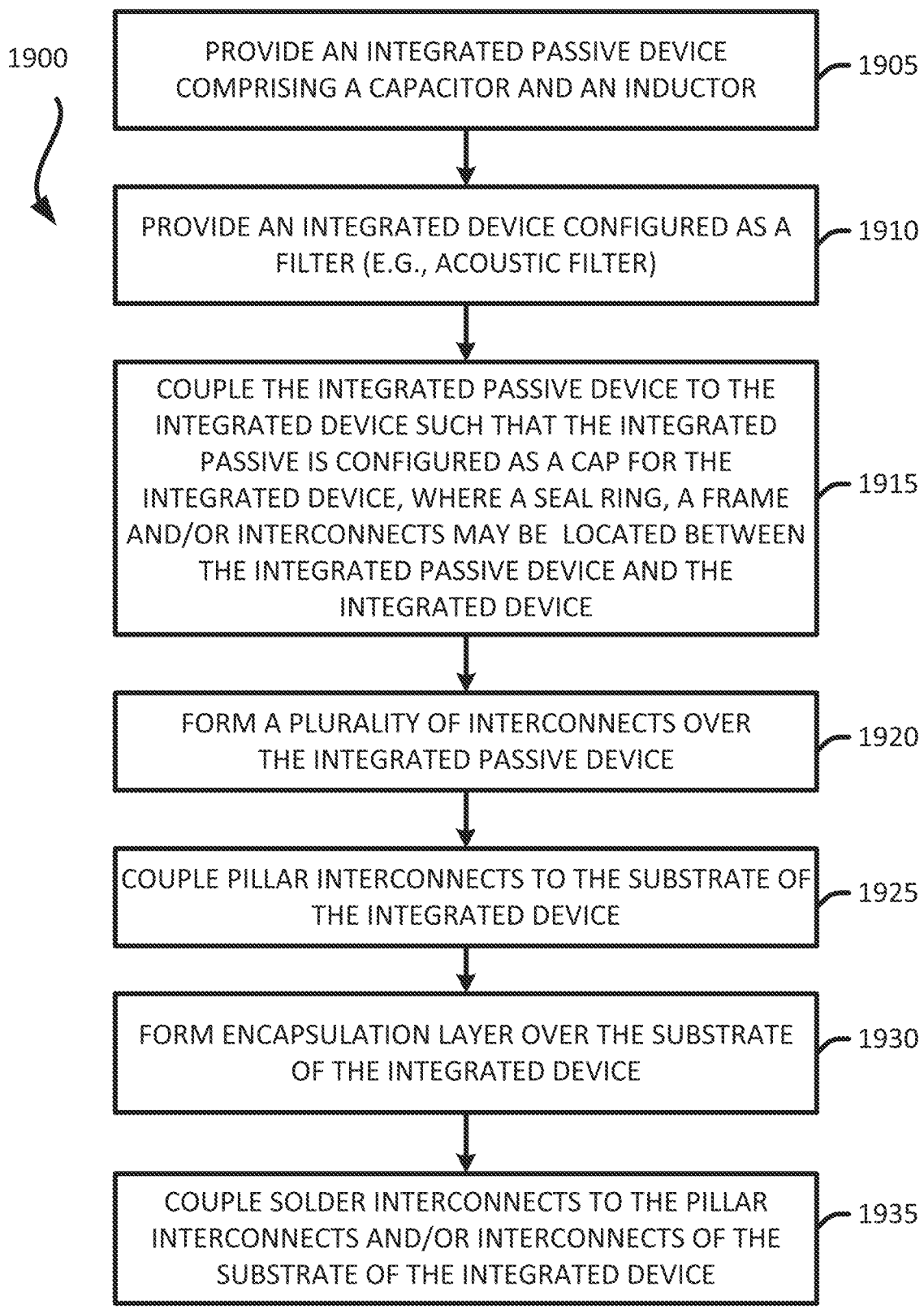
FIG. 19 illustrates an exemplary flow diagram of a method for fabricating a package that includes an integrated device configured as a signal filter, and an integrated passive device configured as a cap for the filter.

Exemplary Flow Diagram of a Method for Fabricating Package Comprising an Integrated Device and an Integrated Passive Device Configured as a Cap for the Integrated Device In some implementations, fabricating a package includes several processes. FIG. 19 illustrates an exemplary flow diagram of a method 1900 for providing or fabricating a package that includes an integrated device and an integrated passive device configured as a cap for the integrated device. In some implementations, the method 1900 of FIG. 19 may be used to provide or fabricate any of the packages described in the disclosure, such as the packages 200, 300, 400, 500, 600, 700, 800 and 900.

It should be noted that the sequence of FIG. 19 may combine one or more processes in order to simplify and/or clarify the method for providing or fabricating a device that includes stacked filters. In some implementations, the order of the processes may be changed or modified.

The method provides (at 1905) an integrated passive device (e.g., 203) that includes a capacitor (e.g., 231) and an inductor. The inductor may be configured to be electrically coupled to the capacitor. The integrated passive device may be a substrate-less integrated passive device. The integrated passive device may include at least one dielectric layer 230 and a plurality of interconnects 232. FIGS. 13A-13D illustrate an example of fabricating an integrated passive device.

The method provides (at 1910) an integrated device (e.g., 201, 301) that is configured as a filter (e.g., acoustic filter). The integrated device may include a piezoelectric substrate (e.g., 110, 130). The integrated device may include at least one transducer (e.g., 212) and a plurality of interconnects (e.g., 214) located over a surface of the piezoelectric substrate. FIG. 16A illustrates an example of fabricating an integrated device configured to operate as a filter.

The method couples (at 1915) the integrated passive device (e.g., 203) to the integrated device (e.g., 201, 301) such that the integrated passive device is configured as a cap for the integrated device. A pick and place process may be used to place the integrated passive device over the integrated device. A thermal compression process may be used to couple (e.g., bond) the integrated passive device to the integrated device. The integrated passive device (e.g., 203) may be coupled to the integrated device (e.g., 201, 301) through a seal ring (e.g., 220), a frame 320 (e.g., polymer frame) and/or a plurality of interconnects (e.g., 222). A void 215, the seal ring, the frame (e.g., polymer frame) and/or the plurality of interconnects (e.g., 222) may be located between the integrated passive device (e.g., 203) and the integrated device (e.g., 201, 301). Stages 5 and 6 of FIG. 16B illustrates an example of an integrated passive device coupled to an integrated device.

The method forms (at 1920) a plurality of interconnects (e.g., 480) over a surface of the integrated passive device (e.g., 203) and/or the substrate of the integrated device (e.g., 301). A sputtering process, a spray coating, and/or a plating process may be used to form the interconnects 480. The plurality of interconnects 480 may be coupled to the plurality of interconnects 232 of the integrated passive device 203. The plurality of interconnects 480 may be coupled to the plurality of interconnects 214 of the substrate of the integrated device 301. Stage 2 of FIG. 18A illustrates an example of a plurality of interconnects formed over a surface of an integrated passive device.

The method couples (at 1925) pillar interconnects (e.g., 460) to the substrate (e.g., 310) of the integrated device (e.g., 301). For example, the pillar interconnects 460 may be coupled to the plurality of interconnects 214 and/or the plurality of interconnects 480. Stage 3 of FIG. 18B illustrates an example of providing and coupling pillar interconnects.

The method forms (at 1930) an encapsulation layer (e.g., 808) over the substrate (e.g., 310) of the integrated device (e.g., 301). The encapsulation layer 808 may include a mold, a resin and/or an epoxy. The encapsulation layer 808 may be means for encapsulation. The encapsulation layer 808 may be located over and coupled to a surface of the substrate 310. The encapsulation layer 808 may encapsulate the plurality of pillar interconnects 460 and the integrated passive device 203. A compression and transfer molding process, a sheet molding process, or a liquid molding process may be used to form the encapsulation layer 808. Stage 4 of FIG. 17B illustrates an example of providing an encapsulation layer.

Figure 20:
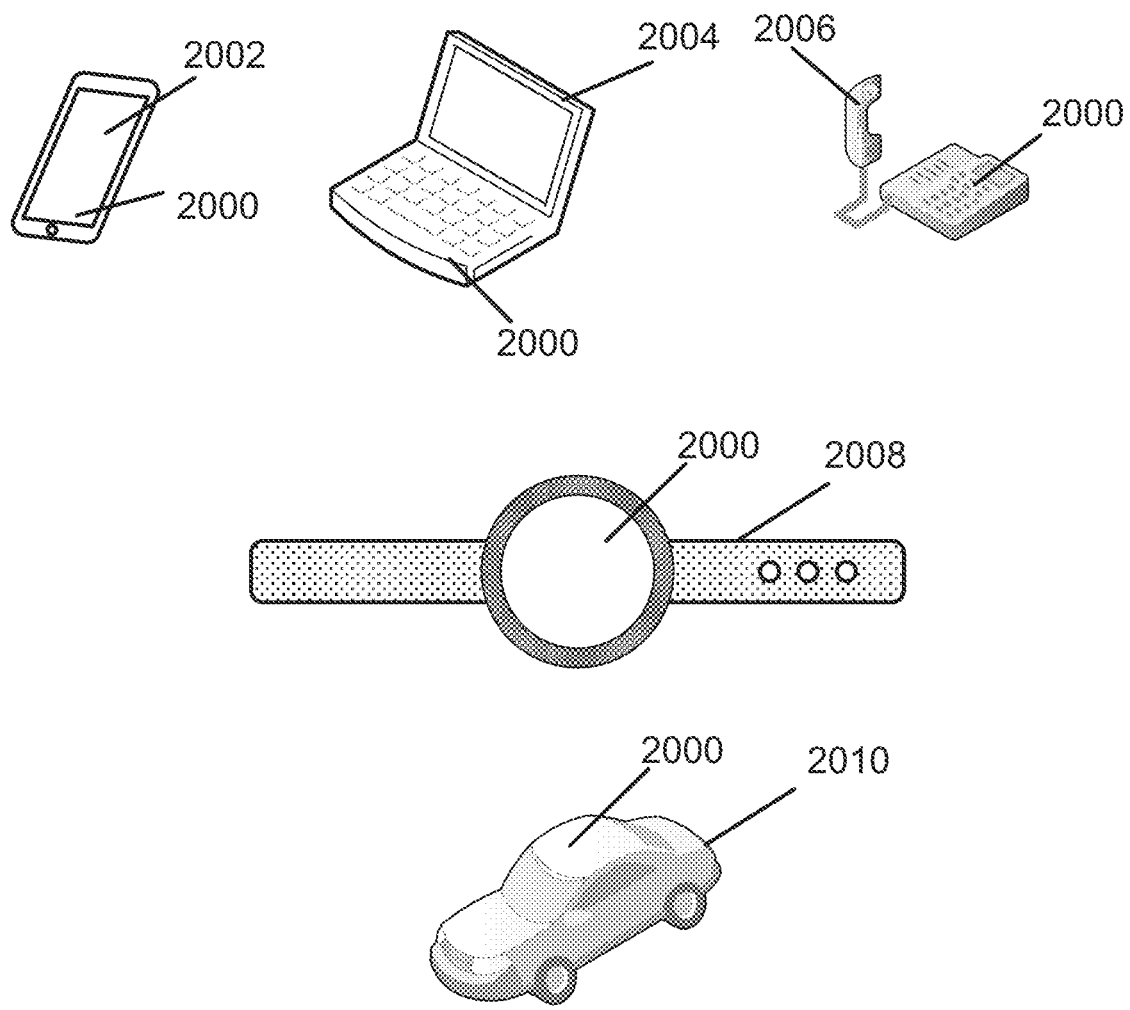
FIG. 20 illustrates various electronic devices that may integrate a die, an integrated device, an integrated passive device (IPD), a passive component, a package, and/or a device package described herein.

The method couples (at 1935) solder interconnects (e.g., 270, 470) to the pillar interconnects (e.g., 460) and/or the integrated passive device (e.g., 203). For example, solder interconnect may be coupled to interconnects (e.g., 232) of the integrated passive device. A reflow process may be used to couple the solder interconnects to the pillar interconnects and/or integrated passive device. Stage 6 of FIG. 17C illustrates an example of solder interconnects coupled to the pillar interconnects and/or interconnects of the integrated passive device Exemplary Electronic Devices FIG. 20 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 2002, a laptop computer device 2004, a fixed location terminal device 2006, a wearable device 2008, or automotive vehicle 2010 may include a device 2000 as described herein. The device 2000 may be, for example, any of the devices and/or integrated circuit (IC) packages described herein. The devices 2002, 2004, 2006 and 2008 and the vehicle 2010 illustrated in FIG. 20 are merely exemplary. Other electronic devices may also feature the device 2000 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-12, 13A-13D, 14, 15, 16A-16B, 17A-17C, 18A-18B and/or 19-20 may be rearranged and/or combined into a single component, process, feature or function or embodied in several components, processes, or functions. Additional elements, components, processes, and/or functions may also be added without departing from the disclosure. It should also be noted FIGS. 1-12, 13A-13D, 14, 15, 16A-16B, 17A-17C, 18A-18B and/or 19-20 and its corresponding description in the present disclosure is not limited to dies and/or ICs. In some implementations, FIGS. 1-12, 13A-13D, 14, 15, 16A-16B, 17A-17C, 18A-18B and/or 19-20 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a current (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
    an integrated device configured as an acoustic filter, the integrated device comprising:

a substrate comprising a piezoelectric material; and
at least one metal layer coupled to a first surface of the substrate, wherein at least part of the at least one metal layer is configured as a transducer that touches the piezoelectric material of the substrate;
an integrated passive device coupled to the integrated device, wherein the integrated passive device is configured as a cap for the integrated device configured as the acoustic filter, wherein the integrated passive device includes a metal-insulator-metal (MIM) capacitor defined by a first interconnect, an insulation layer, and a second interconnect, and wherein the MIM capacitor is located on a frontside of the integrated passive device; and
a void located between the integrated device and the integrated passive device.

2. The package of claim 1, wherein a back side of the integrated passive device is coupled to the integrated device.

3. The package of claim 1, further comprising at least one outer surface interconnect located on a surface of the integrated passive device, wherein the integrated device is configured to be electrically coupled to the integrated passive device through the at least one outer surface interconnect.

4. The package of claim 1, wherein the integrated passive device includes an inductor.

5. The package of claim 1, wherein the integrated device and the integrated passive device are configured to allow an electrical signal from the integrated device to travel through the integrated passive device.

6. The package of claim 1, wherein the integrated device is coupled to the integrated passive device through a seal ring and/or a polymer frame.

7. The package of claim 6,
wherein the integrated device is configured to be electrically coupled to the integrated passive device through at least one interconnect coupled to the integrated device and the integrated passive device, and
wherein the at least one interconnect is located between the integrated device and the integrated passive device.

8. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

9. The package of claim 1,
wherein the substrate comprising the piezoelectric material comprises the substrate and a piezoelectric layer formed over and touching the substrate, and
wherein the at least part of the at least one metal layer that is configured as the transducer touches the piezoelectric layer.

10. The package of claim 1, wherein the acoustic filter is configured to operate as a surface acoustic wave (SAW) filter or a bulk acoustic wave (BAW) filter.

11. An apparatus comprising:
means for acoustic filtering comprising:
a substrate comprising a piezoelectric material; and
at least one transducer coupled to and touching the piezoelectric material of the substrate;
means for passive functionality coupled to the means for acoustic filtering, wherein the means for passive functionality is configured as a cap for the means for acoustic filtering, wherein the means for passive functionality includes a metal-insulator-metal (MIM) capacitor defined by a first interconnect, an insulation layer and a second interconnect; and
a void located between the means for acoustic filtering and the means for passive functionality,
wherein the first interconnect of the MIM capacitor of the means for passive functionality is exposed to the void located between the means for acoustic filtering and the means for passive functionality.

12. The apparatus of claim 11, wherein the means for passive functionality includes a means for inductance.

13. The apparatus of claim 11, the means for acoustic filtering and the means for passive functionality are configured to allow an electrical signal from the means for acoustic filtering to travel through the means for passive functionality.

14. The apparatus of claim 11, wherein the means for acoustic filtering is coupled to the means for passive functionality through a seal ring and/or a polymer frame.

15. The apparatus of claim 11, wherein the means for acoustic filtering is configured to operate as a surface acoustic wave (SAW) filter or a bulk acoustic wave (BAW) filter.

16. The apparatus of claim 11, wherein the at least one transducer is exposed to the void located between the means for acoustic filtering and the means for passive functionality.

17. The apparatus of claim 11, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

18. A method for fabricating a package, comprising:
providing an integrated device configured as an acoustic filter, the integrated device comprising:
a substrate comprising a piezoelectric material; and
at least one metal layer coupled to a first surface of the substrate, wherein at least part of the at least one metal layer is configured as a transducer that touches the piezoelectric material of the substrate; and
coupling an integrated passive device to the integrated device, wherein the integrated passive device is configured as a cap for the integrated device and includes a metal-insulator-metal (MIM) capacitor defined by a first interconnect, an insulation layer, and a second interconnect, wherein coupling the integrated passive device to the integrated device forms a void located between the integrated device and the integrated passive device where the first interconnect of the MIM capacitor is exposed to the void.

19. The method of claim 18, wherein a back side of the integrated passive device is coupled to the integrated device.

20. The method of claim 18, wherein the integrated passive device includes an inductor.

21. The method of claim 18, wherein the integrated device and the integrated passive device are configured to allow an electrical signal from the integrated device to travel through the integrated passive device.

22. The method of claim 18, wherein the integrated device is coupled to the integrated passive device through a seal ring and/or a polymer frame.

* * * * *